(12) United States Patent
Okabe et al.

(10) Patent No.: US 10,685,598 B2
(45) Date of Patent: Jun. 16, 2020

(54) DISPLAY PANEL, DISPLAY APPARATUS, AND METHOD FOR MANUFACTURING DISPLAY PANEL

(71) Applicant: Sharp Kabushiki Kaisha, Sakai, Osaka (JP)

(72) Inventors: Tohru Okabe, Sakai (JP); Hirohiko Nishiki, Sakai (JP); Shinji Nakajima, Sakai (JP); Izumi Ishida, Sakai (JP); Shogo Murashige, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/086,321

(22) PCT Filed: Mar. 27, 2017

(86) PCT No.: PCT/JP2017/012463
§ 371 (c)(1),
(2) Date: Sep. 19, 2018

(87) PCT Pub. No.: WO2017/164419
PCT Pub. Date: Sep. 28, 2017

(65) Prior Publication Data
US 2019/0103052 A1    Apr. 4, 2019

(30) Foreign Application Priority Data
Mar. 25, 2016   (JP) .................................. 2016-062761

(51) Int. Cl.
*G09G 3/34*    (2006.01)
*G09G 3/32*    (2016.01)
(Continued)

(52) U.S. Cl.
CPC ............. *G09G 3/32* (2013.01); *G02B 26/023* (2013.01); *G09F 9/30* (2013.01); *G09F 9/37* (2013.01);
(Continued)

(58) Field of Classification Search
CPC ... H01L 27/00–3297; H01L 29/45–458; H01L 51/00–56; H01L 2924/00–40503;
(Continued)

(56) References Cited

U.S. PATENT DOCUMENTS

2006/0187190 A1    8/2006    Hagood et al.
2006/0187191 A1    8/2006    Hagood et al.
(Continued)

FOREIGN PATENT DOCUMENTS

JP    2011-043856 A    3/2011
JP    2017-026747 A    2/2017

*Primary Examiner* — Amr A Awad
*Assistant Examiner* — Aaron Midkiff
(74) *Attorney, Agent, or Firm* — Keating & Bennett, LLP

(57) ABSTRACT

A wiring delay is prevented or reduced by lowering a wiring resistance without making a wire wider. The present invention includes: a light blocking film (102); a light-transmitting film (106); and a first wiring layer (105A) which serves as part of a wire configured to electrically control an amount of transmitted light for each pixel, the first wiring layer (105A) being provided over the light blocking film (102), and the light-transmitting film (106) being provided over the first wiring layer (105A) so as to cover a side surface of the first wiring layer.

14 Claims, 16 Drawing Sheets

(51) Int. Cl.
  *G09F 9/30* (2006.01)
  *G09F 9/37* (2006.01)
  *G02B 26/02* (2006.01)
  *H01L 27/32* (2006.01)
  *H01L 51/52* (2006.01)

(52) U.S. Cl.
  CPC ...... H01L 27/3276 (2013.01); H01L 51/5203 (2013.01); H01L 27/3272 (2013.01)

(58) Field of Classification Search
  CPC ............ G09G 3/3433; G09G 3/3486; G09G 2300/0421–0426; G02B 6/353; G02B 6/3584; G02B 6/3594; G02B 26/02–26/026; G09F 9/30–375
  USPC ...................................... 345/84–86, 92, 109
  See application file for complete search history.

(56) References Cited

U.S. PATENT DOCUMENTS

| | | |
|---|---|---|
| 2006/0187528 A1 | 8/2006 | Hagood et al. |
| 2006/0187529 A1 | 8/2006 | Hagood et al. |
| 2006/0187530 A1 | 8/2006 | Hagood et al. |
| 2006/0187531 A1 | 8/2006 | Hagood et al. |
| 2006/0209012 A1 | 9/2006 | Hagood, IV |
| 2006/0250325 A1 | 11/2006 | Hagood, IV |
| 2006/0250676 A1 | 11/2006 | Hagood, IV |
| 2006/0256039 A1 | 11/2006 | Hagood et al. |
| 2007/0002156 A1 | 1/2007 | Hagood, IV et al. |
| 2007/0030555 A1 | 2/2007 | Barton et al. |
| 2007/0086078 A1 | 4/2007 | Hagood et al. |
| 2007/0091038 A1 | 4/2007 | Hagood, IV et al. |
| 2007/0159679 A1 | 7/2007 | Hagood et al. |
| 2007/0195026 A1 | 8/2007 | Hagood et al. |
| 2007/0205969 A1 | 9/2007 | Hagood, IV et al. |
| 2007/0216987 A1 | 9/2007 | Hagood et al. |
| 2007/0223080 A1 | 9/2007 | Hagood, IV et al. |
| 2008/0030827 A1 | 2/2008 | Hagood et al. |
| 2008/0037104 A1 | 2/2008 | Hagood et al. |
| 2008/0062500 A1 | 3/2008 | Hagood, IV |
| 2008/0123175 A1 | 5/2008 | Hagood et al. |
| 2008/0129681 A1 | 6/2008 | Hagood et al. |
| 2008/0145527 A1 | 6/2008 | Hagood et al. |
| 2008/0151357 A1 | 6/2008 | Hagood, IV et al. |
| 2008/0158635 A1 | 7/2008 | Hagood |
| 2008/0158636 A1 | 7/2008 | Hagood et al. |
| 2008/0174532 A1 | 7/2008 | Lewis |
| 2008/0278798 A1 | 11/2008 | Hagood et al. |
| 2008/0283175 A1 | 11/2008 | Hagood et al. |
| 2009/0034052 A1 | 2/2009 | Hagood et al. |
| 2009/0103164 A1 | 4/2009 | Fijol et al. |
| 2009/0195855 A1 | 8/2009 | Steyn et al. |
| 2009/0244678 A1 | 10/2009 | Hagood, IV et al. |
| 2010/0110518 A1 | 5/2010 | Wu et al. |
| 2011/0122474 A1 | 5/2011 | Payne et al. |
| 2011/0148948 A1 | 6/2011 | Gandhi et al. |
| 2011/0164067 A1 | 7/2011 | Lewis et al. |
| 2011/0242464 A1* | 10/2011 | Kawasaki ............ H01L 29/458 349/106 |
| 2011/0255146 A1 | 10/2011 | Brosnihan et al. |
| 2011/0267668 A1 | 11/2011 | Hagood, IV et al. |
| 2012/0169795 A1 | 7/2012 | Hagood et al. |
| 2012/0200906 A1 | 8/2012 | Wu et al. |
| 2012/0280971 A1 | 11/2012 | Hagood et al. |
| 2012/0287494 A1* | 11/2012 | Takahashi ............. G02B 26/02 359/230 |
| 2012/0300279 A1* | 11/2012 | Muneyoshi .......... G02B 26/023 359/230 |
| 2012/0320111 A1 | 12/2012 | Hagood, IV et al. |
| 2012/0320112 A1 | 12/2012 | Hagood, IV et al. |
| 2012/0320113 A1 | 12/2012 | Hagood, IV et al. |
| 2013/0010341 A1 | 1/2013 | Hagood et al. |
| 2013/0010342 A1 | 1/2013 | Hagood, IV et al. |
| 2013/0010344 A1 | 1/2013 | Hagood et al. |
| 2013/0335806 A1 | 12/2013 | Steyn et al. |
| 2013/0342522 A1 | 12/2013 | Hagood et al. |
| 2014/0085698 A1 | 3/2014 | Wu et al. |
| 2015/0286047 A1 | 10/2015 | Lewis et al. |
| 2015/0294613 A1 | 10/2015 | Gandhi et al. |
| 2016/0225912 A1* | 8/2016 | Cao ...................... H01L 29/786 |
| 2016/0275876 A1 | 9/2016 | Hagood et al. |
| 2016/0343872 A1* | 11/2016 | Ge ...................... G02F 1/13439 |

* cited by examiner

FIG. 3

|  | t1 | t2 | t3 | t4 | t5 | t6 |
|---|---|---|---|---|---|---|
| TRANSISTOR T1 | off | on | off | off | off | on |
| TRANSISTOR T2 | off | on | off | off | off | on |
| TRANSISTOR T3 | on | off | off | off | off | off |
| TRANSISTOR T4 | off | off | off | off | off | off |
| TRANSISTOR T5 | off | off | off | on | on | off |
| MASTER NODE Nma | L | H | H | H | H | H |
| SLAVE NODE Nsl | L | H | H | L | L | H |
| STORAGE NODE Nst | L | L | L | L | L | L |
| ACTUATE LINE A | H | ← | ← | ← | ← | ← |
| PRECHARGE LINE P | L | H | L | L | L | H |
| SHUTTER LINE S | H or L | ← | ← | ← | ← | ← |
| ENABLE LINE E | L | H | H | L | L | H |
| GATE LINE Gn | H | L | L | L | L | L |
| SOURCE LINE Sn | L | L | L | L | L | L |
| UPDATE LINE U | H | H | L | L | H | H |

|  | t7 | t8 | t9 | t10 | t11 | t12 |
|---|---|---|---|---|---|---|
| TRANSISTOR T1 | off | on | off | off | off | on |
| TRANSISTOR T2 | off | on | off | off | off | on |
| TRANSISTOR T3 | on | off | off | off | off | off |
| TRANSISTOR T4 | off | off | on | on | off | off |
| TRANSISTOR T5 | off | off | off | off | off | off |
| MASTER NODE Nma | L | H | L | L | L | H |
| SLAVE NODE Nsl | L | H | H | H | H | H |
| STORAGE NODE Nst | L | H | H | H | H | H |
| ACTUATE LINE A | H | ← | ← | ← | ← | ← |
| PRECHARGE LINE P | L | H | L | L | L | H |
| SHUTTER LINE S | H or L | ← | ← | ← | ← | ← |
| ENABLE LINE E | L | H | H | L | L | H |
| GATE LINE Gn | H | L | L | L | L | L |
| SOURCE LINE Sn | H | H | H | H | H | H |
| UPDATE LINE U | H | H | L | L | H | H |

DISPLAY PANEL, DISPLAY APPARATUS, AND METHOD FOR MANUFACTURING DISPLAY PANEL

TECHNICAL FIELD

The present invention relates to a display panel, a display device, and a method for manufacturing a display panel.

BACKGROUND ART

Known is a display device in which a Micro Electro Mechanical Systems (MEMS) shutter that mechanically opens and closes is used (hereinafter, such a display device is referred to as a "MEMS display.")

Such a MEMS display is exemplified by a MEMS display that is disclosed in Patent Literature 1 and includes (i) a MEMS substrate including a MEMS shutter provided for each pixel and (ii) a backlight.

The MEMS substrate of the MEMS display disclosed in Patent Literature 1 includes a transparent substrate, an aperture layer, a first dielectric layer, and a first conductor layer which are provided in this order from the backlight side, the aperture layer having a light blocking effect and having an opening corresponding to each pixel, the first dielectric layer being transparent and covering the aperture layer so as to fill up the opening of the aperture layer, the first conductor layer constituting a gate line of a transistor that controls opening and closing a shutter.

CITATION LIST

Patent Literature

[Patent Literature 1]
Japanese Patent Application Publication, Tokukai, No. 2011-43856 (Publication Date: Mar. 3, 2011)

SUMMARY OF INVENTION

Technical Problem

In a case where such a conventional MEMS display as disclosed in Patent Literature 1 is made larger, it is feared that a delay in control signal for opening and closing of the shutter may occur in the MEMS display and thus a display quality of the MEMS display may be lost.

In view of this, a delay in control signal can be prevented or reduced by lowering a wiring resistance by causing a wiring layer constituting a wire for, for example, a gate line of a transistor to be thick.

However, in a case where the wiring layer is made thick, a tapered part thereof is widely spread. This causes a layout-related problem. Meanwhile, in a case where a taper angle of the wiring layer is made greater, a side surface (tapered surface) of the wiring layer tends to be less covered with a gate insulating film that is vapor-deposited on the wiring layer. As a result, part of the side surface of the wiring layer is exposed, so that the wiring layer is oxidized. It is thus difficult to lower a wiring resistance by making a wire thicker without making the wire wider.

The present invention has been made in view of the problems, and an object of the present invention is to provide a display panel in which a wiring delay is prevented or reduced by lowering a wiring resistance without making a wire wider, a display device, and a method for manufacturing the display panel.

Solution to Problem

In order to attain the object, a display panel in accordance with an aspect of the present invention is a display panel including, for each pixel, a shutter mechanism that mechanically opens and closes, and controlling the shutter mechanism so as to transmit or block light for the each pixel, the display panel further including: a substrate; a light blocking film which is provided over the substrate so as to have an opening; a light-transmitting film by which the opening is filled and flattened; and a first wiring layer which serves as part of a wire configured to electrically control opening and closing of the shutter mechanism, the first wiring layer being provided over the light blocking film, and the light-transmitting film being provided in a layer higher than the first wiring layer so as to cover a side surface of the first wiring layer.

Furthermore, in order to attain the object, a method in accordance with an aspect of the present invention for manufacturing a display panel including, for each pixel, a shutter mechanism that mechanically opens and closes, and controlling the shutter mechanism so as to transmit or block light for the each pixel, the method includes the steps of: forming a light blocking film over a substrate so that the light blocking film has an opening; forming, over the light blocking film, a first wiring layer which serves as part of a wire configured to electrically control opening and closing of the shutter mechanism; and forming a light-transmitting film in a layer higher than the first wiring layer so that the light-transmitting film covers a side surface of the first wiring layer and fills and flattens the opening.

Advantageous Effects of Invention

An aspect of the present invention makes it possible to provide a display panel in which a wiring delay is prevented or reduced without making a wire wider, and a method for manufacturing the display panel.

BRIEF DESCRIPTION OF DRAWINGS

FIG. 3 is a view showing a state of each transistor and a state of each node during driving of a MEMS display.

DESCRIPTION OF EMBODIMENTS

Embodiment 1

An embodiment of the present invention is specifically described below with reference to FIGS. 1 through 14.

<Overall Configuration of MEMS Display>

Figure 1:
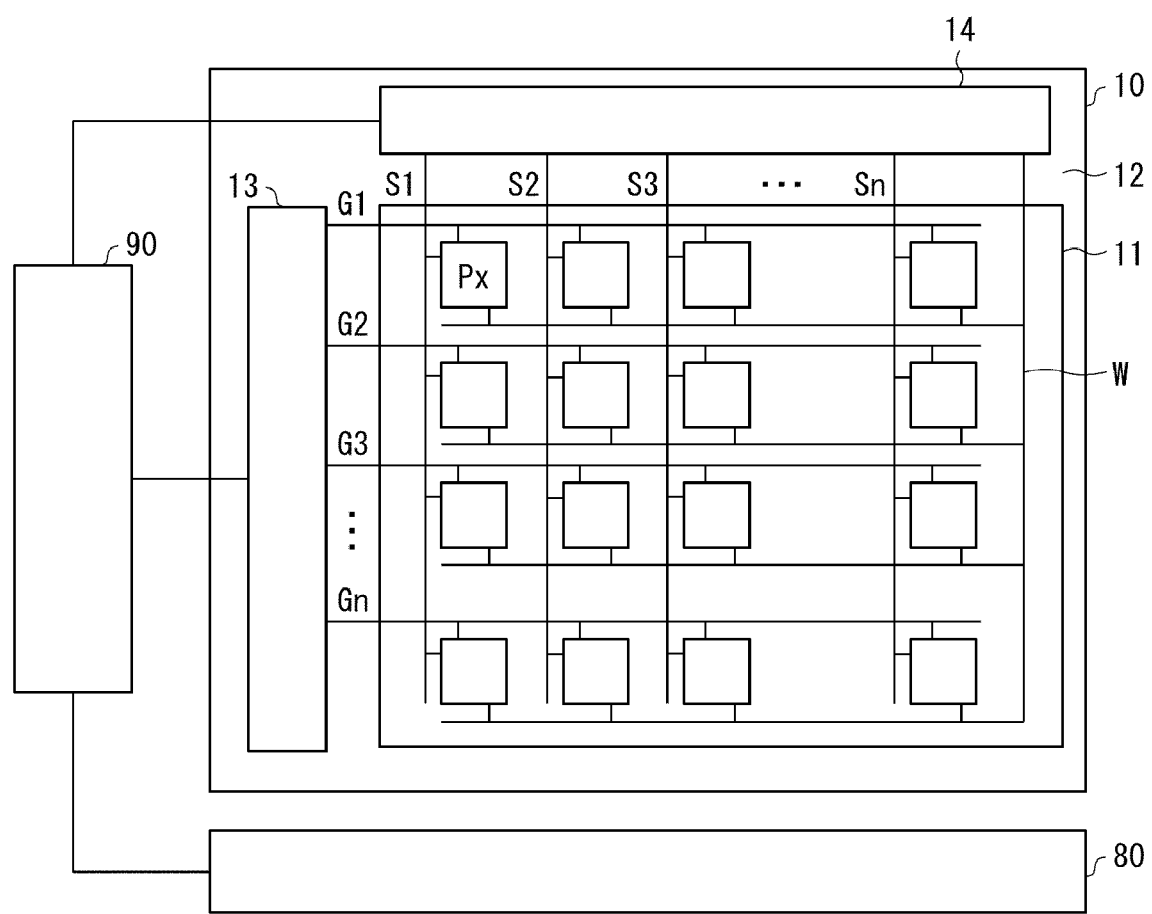
FIG. 1 is a view schematically illustrating a MEMS display in accordance with Embodiment 1 of the present invention.

FIG. 1 is a view schematically illustrating a MEMS display in accordance with Embodiment 1 of the present invention.

As illustrated in FIG. 1, a MEMS display 1 (display device) includes a MEMS display panel 10 (display panel), a backlight 80 (light source), and a control section 90.

In accordance with a video signal that is externally supplied to the control section 90, the control section 90 supplies, to each of the MEMS display panel 10 and the backlight 80, a control signal for displaying an image in the MEMS display panel 10.

The MEMS display panel 10 includes a display region 11 in which an image is to be displayed, and a non-display region 12. The display region 11 includes a plurality of pixels Px, a plurality of gate lines Gn provided so as to correspond to respective rows of pixels, and a plurality of source lines Sn provided so as to correspond to respective columns of pixels, and various wires W.

The non-display region 12 includes a gate driver 13 configured to supply a gate signal to a gate line Gn, and a source driver 14 configured to supply a data signal to a source line Sn.

The backlight 80 is provided so as to face a back surface (counter substrate 200 (described later) side back surface) of the MEMS display panel 10. The backlight 80 is configured to emit light from the back surface of the MEMS display panel 10 to the display region 11. More specifically, the back surface of the MEMS display panel 10 is provided with a light guide plate that is provided so as to be superposed on the display region 11. Light emitted from the backlight 80 enters the light guide plate through an edge of the light guide plate, is guided by the light guide plate, and then exits from the light guide plate to the display region 11. The backlight 80 is driven by a field sequential driving method.

<Pixel Configuration>

Figure 2:
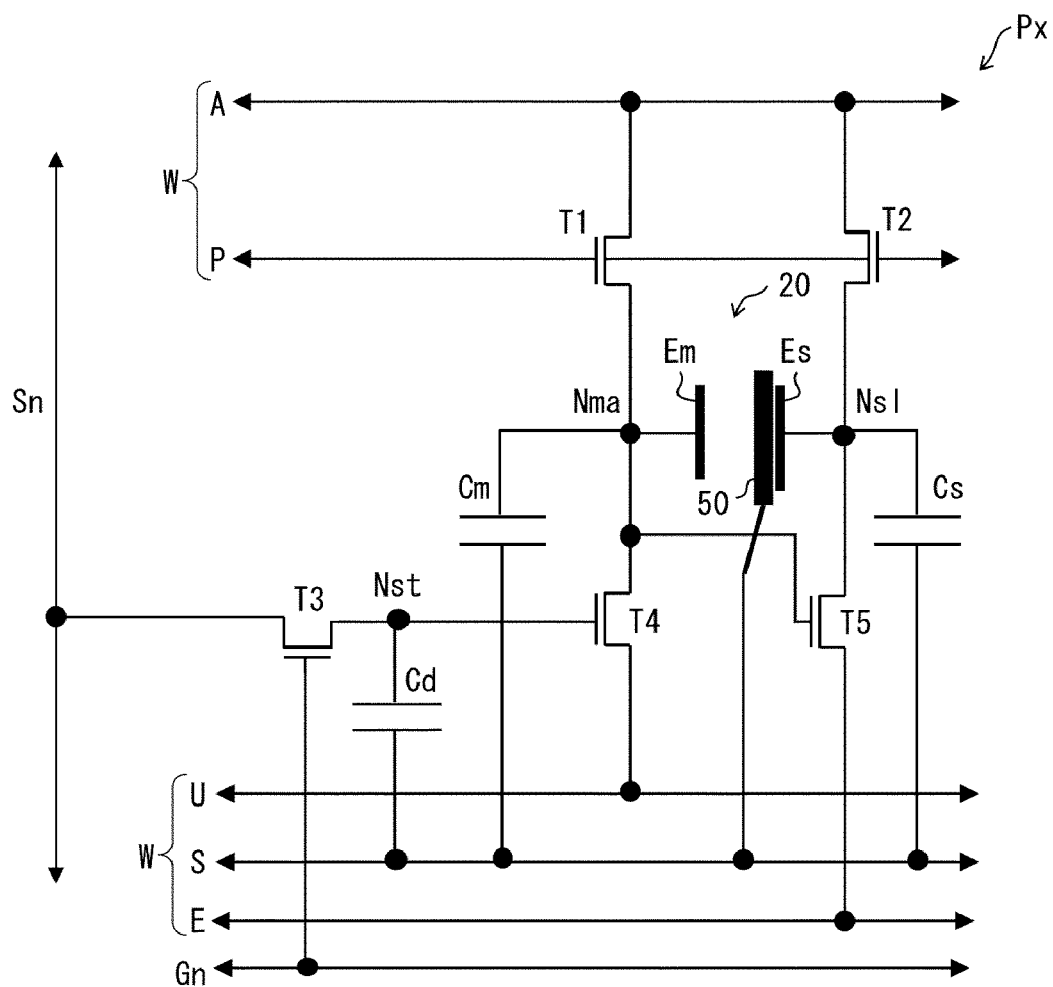
FIG. 2 is a circuit diagram illustrating a pixel configuration of a MEMS display.

FIG. 2 is a circuit diagram illustrating a pixel configuration of a MEMS display.

As illustrated in FIG. 2, each pixel Px includes a shutter mechanism 20 that mechanically opens and closes, first through fifth transistors T1 through T5, a data retention capacitor Cd, a master capacitor Cm, and a slave capacitor Cs. The shutter mechanism 20 includes a master electrode Em, a slave electrode Es, and a shutter 50.

Furthermore, as illustrated in FIG. 2, the various wires W illustrated in FIG. 1 include an actuate line A, a precharge line P, an update line U, a shutter line S, and an enable line E.

For example, an $H_1$ level voltage is supplied to the actuate line A at all times, a voltage which is supplied to the precharge line P switches between an L level voltage and the $H_1$ level voltage, a voltage which is supplied to the update line U switches between the L level voltage and an $H_2$ level voltage ($H_2 < H_1$), a voltage which is supplied to the shutter line S switches between the L level voltage and the $H_1$ level voltage, a voltage which is supplied to the enable line E switches between the L level voltage and the $H_1$ level voltage, a gate voltage which is supplied to the gate line Gn switches between the L level voltage and an $H_3$ level voltage ($H_2 < H_3 < H_1$), and a data voltage which is supplied to the source line Sn switches between the L level voltage and the $H_2$ level voltage.

Periodical switching of the voltage, which is supplied to the shutter line S, between the L level voltage and the $H_1$ level voltage allows the shutter 50 to be prevented from being electrically charged.

Note that in the following description, an intersection of a drain electrode of the third transistor T3, a first end of the data retention capacitor Cd, and a gate electrode of the fourth transistor is referred to as a storage node Nst, an intersection of a drain electrode of the fourth transistor T4, the master electrode Em, a first end of the master capacitor Cm, and a drain of the first transistor T1 is referred to as a master node Nma, and an intersection of a drain electrode of the fifth transistor T5, the slave electrode Es, a first end of the slave capacitor Cs, and a drain of the second transistor T2 is referred to as a slave node Nsl.

The third transistor T3 has a gate electrode which is connected to the gate line Gn, a source electrode which is connected to the source line Sn, and the drain electrode which is connected to each of the first end of the data retention capacitor Cd and the gate electrode of the fourth transistor.

The fourth transistor T4 has a source electrode which is connected to the update line U and the drain electrode which is connected to each of the master electrode Em, the first end of the master capacitor Cm, and the drain of the first transistor T1.

The fifth transistor T5 has a gate electrode which is connected to the drain electrode of the fourth transistor T4, a source electrode which is connected to the enable line E, and the drain electrode which is connected to each of the slave electrode Es, the first end of the slave capacitor Cs, and the drain of the second transistor T2.

The first transistor T1 and the second transistor T2 each have a gate electrode which is connected to the precharge line P and a source electrode which is connected to the actuate line A.

The shutter 50, a second end of the data retention capacitor Cd, a second end of the master capacitor Cm, and a second end of the slave capacitor Cs are each connected to the shutter line S.

The data retention capacitor Cd is a capacitor configured to retain a data signal for opening and closing the shutter mechanism 20.

The master capacitor Cm is a capacitor configured to stabilize a shutter driving voltage which is retained by the master node Nma.

The slave capacitor Cs is a capacitor configured to stabilize a shutter driving voltage which is retained by slave node Nsl.

FIG. 3 is a view showing a state of each transistor and a state of each node during driving of a MEMS display. Times t1 to t6 each indicate a time at which a data signal which is supplied via the source line Sn has an L voltage (low voltage). Times t7 to t12 each indicate a time at which the data signal which is supplied via the source line Sn has an H voltage (high voltage).

<Operation of Pixel Circuit>

At the time t1 or t7 shown in a table of FIG. 3, in a case where the H voltage is supplied to the gate electrode of the third transistor T3 via the gate line Gn, the third transistor T3 is turned on, and a data voltage which determines an open/closed state of the shutter 50 is stored in the data retention capacitor Cd via the source line Sn and the third transistor T3.

Next, at the time t2 or t8, in a case where the H voltage is supplied to each of the gate electrode of the first transistor T1 and the gate electrode of the second transistor T2 via the precharge line P, the H voltage of the actuate line A is stored in the master capacitor Cm via the first transistor T1, and the H voltage of the actuate line A is stored in the slave capacitor Cs via the second transistor T2.

Subsequently, at the time t3 or t9, the voltage of the update line U is changed from the H voltage to the L voltage, and the fourth transistor T4 is turned on or off in accordance with the data voltage. Specifically, in a case where the data voltage is the L voltage as in the time t3, the fourth transistor T4 remains off. Meanwhile, in a case where the data voltage is the H voltage, the fourth transistor T4 is turned on.

Then, at the time t4 or t10, the voltage of the enable line E is changed from the H voltage to the L voltage, and the fifth transistor T5 is turned on or off in accordance with a voltage of the master node Nma. Specifically, in a case where the master node Nma has the H voltage as in the time t4, the fifth transistor T5 is turned on, so that the slave node Nsl has the L voltage. Meanwhile, in a case where the master node Nma has the L voltage as in the time t10, the fifth transistor T5 is turned off, so that the slave node Nsl has the H voltage.

As described above, the master node Nma (master electrode Em) and the slave node Nsl (slave electrode Es) are reversed in polarity.

<Shutter>

Figure 4:
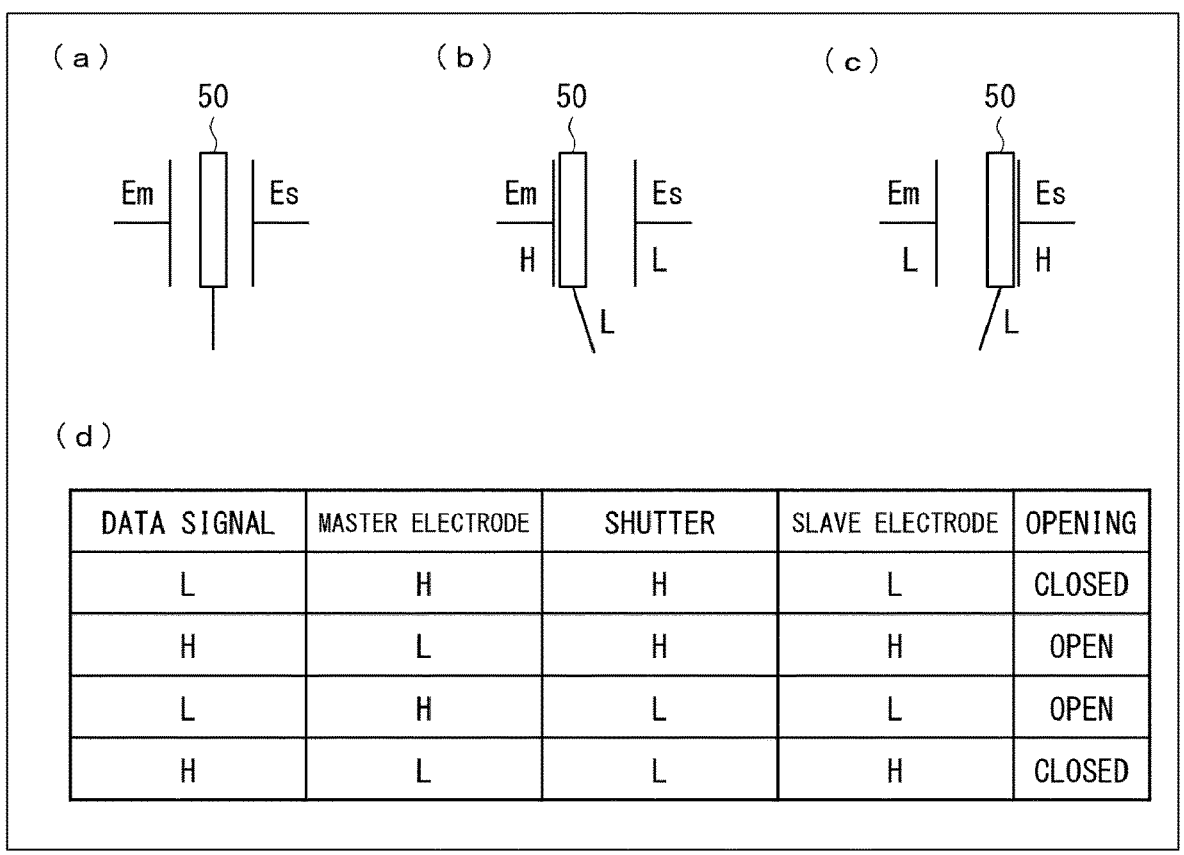
FIG. 4 is a view for describing an operation of a shutter. (a) of FIG. 4 illustrates a state in which the shutter is in an intermediate position. (b) of FIG. 4 illustrates a state in which the shutter is attracted to a master electrode. (c) of FIG. 4 illustrates a state in which the shutter is attracted to a slave electrode. (d) of FIG. 4 is a table showing a relationship between respective electric potentials of the electrodes and the shutter and an open/closed state.

FIG. 4 is a view for describing an operation of a shutter. (a) of FIG. 4 illustrates a state in which the shutter is in an intermediate position. (b) of FIG. 4 illustrates a state in which the shutter is attracted to a master electrode. (c) of FIG. 4 illustrates a state in which the shutter is attracted to a slave electrode. (d) of FIG. 4 is a table showing a relationship between respective electric potentials of the electrodes and the shutter and an open/closed state.

As illustrated in (a) of FIG. 4, the shutter 50 is in a default position in a state in which no voltage is applied to each of the shutter 50, the master electrode Em, and the slave electrode Es.

As illustrated in (b) of FIG. 4, the shutter 50 is attracted to the master electrode Em in a state in which the H voltage is applied to the master electrode Em, the L voltage is applied to the slave electrode Es, and the L voltage is applied to the shutter 50.

Meanwhile, as illustrated in (c) of FIG. 4, the shutter 50 is attracted to the slave electrode Es in a state in which the L voltage is applied to the master electrode Em, the H voltage is applied to the slave electrode Es, and the L voltage is applied to the shutter 50.

The shutter 50 is thus attracted to one of the master electrode Em and the slave electrode Es which one is reversed in polarity from the shutter 50. As shown in (d) of FIG. 4, an open/closed state of an opening of the pixel Px is controlled in accordance with to which of the master electrode Em and the slave electrode Es the shutter 50 is attracted. In the example of FIG. 4, the pixel Px is in an open state in a case where the shutter 50 is closer to the master electrode Em, whereas the pixel Px is in a closed state in a case where the shutter 50 is closer to the slave electrode Es.

Figure 5:
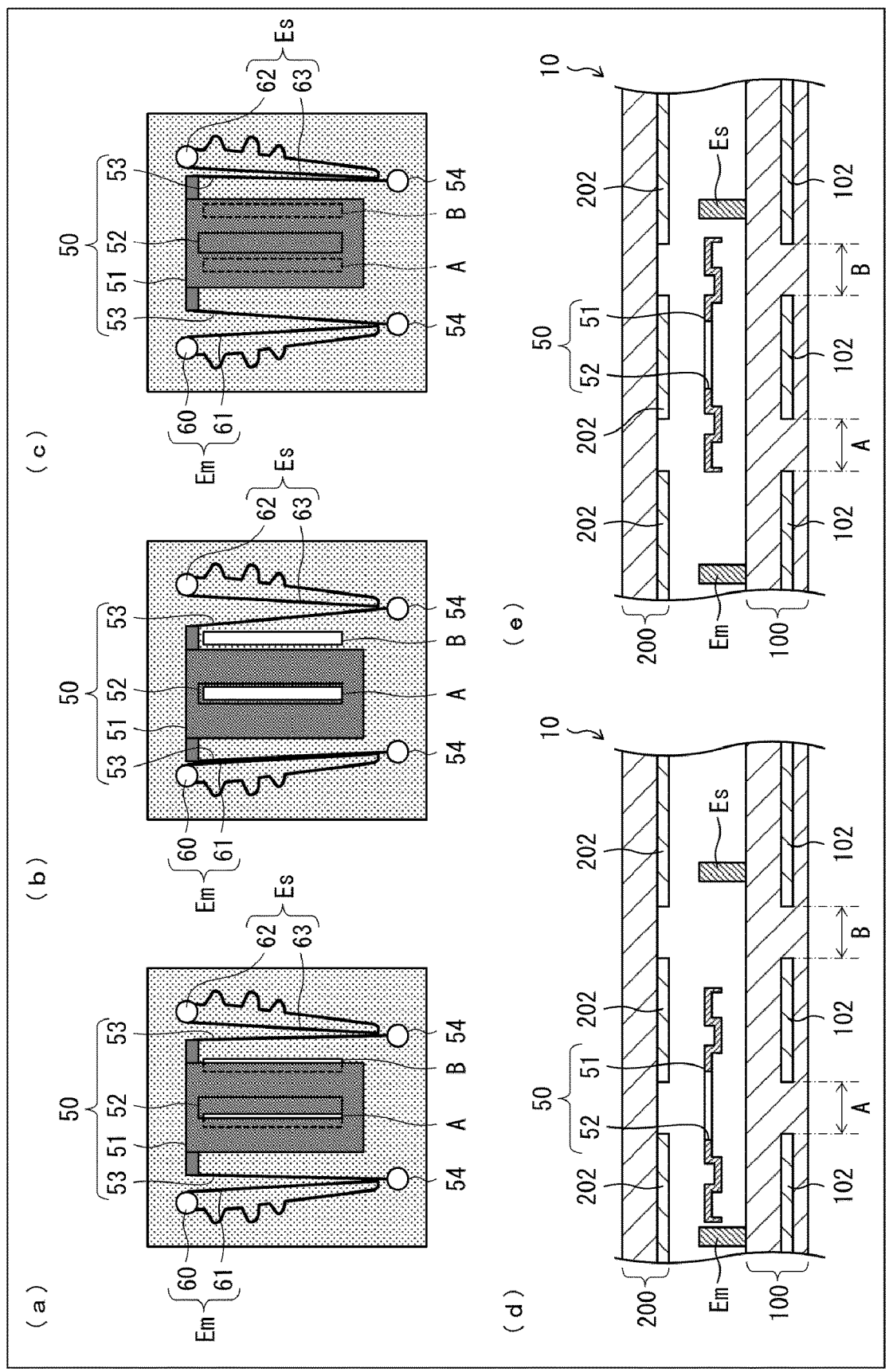
FIG. 5 is a view illustrating a configuration of a shutter mechanism. (a) of FIG. 5 is a plan view of the shutter mechanism in which a shutter is in an intermediate position. (b) of FIG. 5 is a plan view of the shutter mechanism in which a pixel is in an open state. (c) of FIG. 5 is a plan view of the shutter mechanism in which a pixel is in a closed state. (d) of FIG. 5 is a cross-sectional view corresponding to (b) of FIG. 5. (e) of FIG. 5 is a cross-sectional view corresponding to (c) of FIG. 5.

FIG. 5 is a view illustrating a configuration of a shutter mechanism. (a) of FIG. 5 is a plan view of the shutter mechanism in which a shutter is in an intermediate position. (b) of FIG. 5 is a plan view of the shutter mechanism in which a pixel is in an open state. (c) of FIG. 5 is a plan view of the shutter mechanism in which a pixel is in a closed state. (d) of FIG. 5 is a cross-sectional view corresponding to (b) of FIG. 5. (e) of FIG. 5 is a cross-sectional view corresponding to (c) of FIG. 5.

As illustrated in (a) of FIG. 5, the master electrode Em includes a driving beam anchor 60 which is fixed to a TFT substrate 100 (described later) (active matrix substrate) and a driving beam 61 which is electrically connected to the driving beam anchor 60. The slave electrode Es includes a driving beam anchor 62 which is fixed to the TFT substrate 100 (described later) and a driving beam 63 which is electrically connected to the driving beam anchor 62. The driving beam 61 and the driving beam 63 are provided so as to face each other across the shutter 50.

The shutter 50 includes a shutter body 51 which is substantially rectangular in plan view, two beam-like shutter beams 53, and two shutter anchors 54. The shutter anchors 54 are electrically connected to the shutter line S, and the shutter body 51 is electrically connected to the shutter line S via the shutter anchors 54 and the shutter beams 53. The two shutter beams 53 have respective (i) first ends which are connected to respective ends of the shutter body 51 and (ii) second ends which are connected to the respective shutter anchors 54. The shutter beams 53 are flexible. One of the shutter beams 53 is provided so as to face the driving beam 61, and the other of the shutter beams 53 is provided so as to face the driving beam 63. Since the shutter beams 53 are flexible, the shutter body 51 is supported while being movable with respect to the TFT substrate 100.

The shutter body 51 is provided with a rectangular opening 52. Furthermore, openings which are provided in the TFT substrate 100 and the counter substrate 200 cause the each pixel Px to have two openings A and B.

As illustrated in (b) of FIG. 5, the shutter body 51 is attracted to the master electrode Em so as to move relatively to the TFT substrate 100. In a case where the opening 52 overlaps the opening A in plan view, the pixel Px is in the open state and transmits light from the backlight 80.

Meanwhile, as illustrated in (c) of FIG. 5, the shutter body 51 is attracted to the slave electrode Es so as to move relatively to the TFT substrate 100. In a case where a part of the shutter body 51 which part is different from the opening A overlaps the openings A and B in plan view, the pixel Px is in the closed state and blocks the light from the backlight 80. According to the MEMS display panel 10, an amount of transmitted light can be thus controlled for each pixel.

<Configuration of MEMS Display Panel>

The following description discusses a specific configuration of the MEMS display panel 10.

Figure 6:
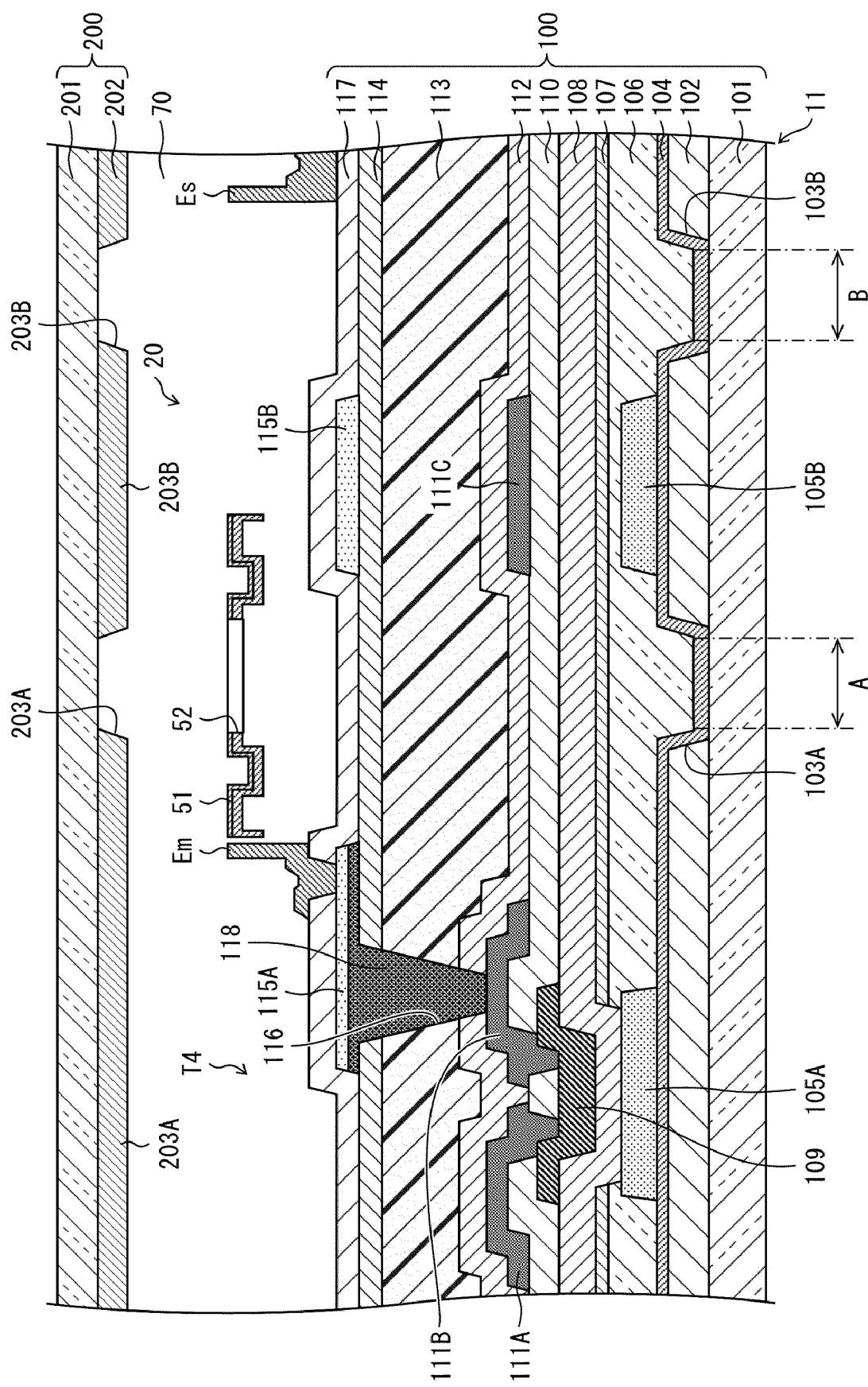
FIG. 6 is a cross-sectional view illustrating a configuration of a part of a MEMS display panel which part includes a fourth transistor and a shutter mechanism.

FIG. 6 is a cross-sectional view illustrating a configuration of a part of a MEMS display panel which part includes a fourth transistor and a shutter mechanism.

As illustrated in FIG. 6, the MEMS display panel 10 includes the TFT substrate 100 which is provided on the display surface side and the counter substrate 200 which is provided on the backlight 80 side. Furthermore, a space between the TFT substrate 100 and the counter substrate 200 is provided with the shutter mechanism 20 and filled with oil 70.

The counter substrate 200 includes a glass substrate 201 and a light blocking film 202 which is provided on the glass substrate 201 so as to face the TFT substrate 100. The light blocking film 202 is provided with an opening 203A and an opening 203B which correspond to the opening A and the opening B, respectively, of the pixel Px.

<TFT Substrate>

The TFT substrate 100 includes a glass substrate 101 (substrate) and layers (e.g., a wiring layer) provided on the glass substrate 101. The following description specifically discusses the layers.

<Light Blocking Film 102>

As illustrated in FIG. 6, a light blocking film 102 is provided on the glass substrate 101. The light blocking film 102 is provided with an opening 103A which faces the opening 203A of the counter substrate 200 and an opening 103B which faces the opening 203B. The openings A and B of the pixel Px are defined by the opening 203A and the opening 103A, and the opening 203B and the opening 103B.

The light blocking film 102 can have a thickness which falls within the range of 0.5 μm to 3 μm. The light blocking film 102 is made of a material which blocks light. Furthermore, the light blocking film 102 is preferably made of a material which does not easily reflect light. In a case where the TFT substrate 100, which is the substrate on the display surface side, includes the light blocking film 102 which is made of the material which does not easily reflect light, external light that enters the MEMS display panel 10 from a display viewing side can be prevented or reduced from being reflected by the light blocking film 102 and returning to the display viewing side.

Furthermore, in a case where the light blocking film 102 is made of a high-resistance material, a large parasitic capacitance can be prevented or reduced from being defined by the light blocking film 102 and an electrically conductive film constituting, for example, a TFT (described later).

(First Inorganic Insulating Film 104)

A surface of the light blocking film 102 and a surface of the glass substrate 101 in the openings 103A and 103B are provided with a first inorganic insulating film 104 so that (a) the light blocking film 102 and the glass substrate 101 and (b) a film which is provided in a layer higher than the light blocking film 102 and the glass substrate 101 more securely adhere to each other. The first inorganic insulating film 104 can have a thickness which falls within the range of 50 nm to 200 nm, and the first inorganic insulating film 104 can be made of a material such as an $SiO_2$ film. Note that the first inorganic insulating film 104 can be omitted in a case where the surface of the light blocking film 102 and the surface of the glass substrate 101 in the openings 103A and 103B are plasma-treated so that (a) the light blocking film 102 and the glass substrate 101 and (b) the film which is provided in a layer higher than the light blocking film 102 and the glass substrate 101 more securely adhere to each other.

(First Wiring Layer 105)

On the first inorganic insulating film 104, a first wiring layer 105 is provided so as to overlap the light blocking film 102 in plan view.

A first wiring layer 105A which is provided in a transistor region T functions as a gate electrode of the fourth transistor T4.

(Light-Transmitting Film 106)

On the light blocking film 102 and the first wiring layer 105, a light-transmitting film 106 is provided. More specifically, the light-transmitting film 106 is provided so that only an upper surface of the first wiring layer 105A is exposed and a difference in level which difference is caused by the light blocking film 102 and a first wiring layer 105B disappears. In a case where the light-transmitting film 106 is used, during a process for manufacturing the MEMS display panel 10, to cause disappearance of a difference in level between the light blocking film 102 and the first wiring layer 105, each layer that is provided in a layer higher than the first wiring layer 105 can be patterned with higher accuracy.

In order that a side surface (tapered surface) of the first wiring layer 105A can be covered with the light-transmitting film 106, the light-transmitting film 106 is formed so as to be thicker than the first wiring layer 105. For example, the light-transmitting film 106 whose thickness is set to approximately 0.5 μm to 3 μm allows the first wiring layer 105 to be more coverable with the light-transmitting film 106 also in a case where the first wiring layer 105 has a thickness of not less than 500 nm.

Also in a case where the first wiring layer 105 is made greater in thickness and made greater in taper angle, the side surface (tapered surface) of the first wiring layer 105 can be covered with the light-transmitting film 106. This makes it possible to greatly reduce a wiring resistance without making the first wiring layer 105 wider. In particular, also in a case where the thickness of the first wiring layer 105 is set to not less than 1 μm, a taper can be made substantially upright. This allows the first wiring layer 105 to have a width that is narrow while being prevented from increasing, and consequently makes it possible to easily manufacture a large-sized high-definition display.

According to the MEMS display 1 of Embodiment 1, the light-transmitting film 106 is provided over the first wiring layer 105. Thus, as compared with a conventional MEMS display which is configured such that a first wiring layer is provided over a light-transmitting film, the MEMS display 1 of Embodiment 1 further allows a space between the first wiring layer 105 and a second wiring layer 111 (described later) to be sufficiently left. This makes it possible to restrain a parasitic capacitance from being defined by the first wiring layer 105 serving as the gate electrode and the second wiring layer 111 serving as the source electrode.

(Second Inorganic Insulating Film 107)

On a surface of the light-transmitting film 106, a second inorganic insulating film 107 is provided so that the light-transmitting film 106 and a film which is provided in a layer higher than the light-transmitting film 106 more securely adhere to each other. The second inorganic insulating film 107 can have a thickness which falls within the range of 50 nm to 200 nm, and the second inorganic insulating film 107 can be made of a material such as an $SiO_2$ film. Note that the second inorganic insulating film 107 can be omitted in a case where the surface of the light-transmitting film 106 is plasma-treated so that the light-transmitting film 106 and the film which is provided in a layer higher than the light-transmitting film 106 more securely adhere to each other.

The light-transmitting film 106 and the second inorganic insulating film 107 have an opening so that the upper surface of the first wiring layer 105A is exposed.

(Gate Insulating Film 108)

On the second inorganic insulating film 107 and the first wiring layer 105A, a gate insulating film 108 is provided. The gate insulating film 108 can have a thickness which falls within the range of 100 nm to 500 nm.

(Semiconductor Layer 109)

On the gate insulating film 108, a semiconductor layer 109 is provided so as to overlap the first wiring layer 105A in plan view. The semiconductor layer 109 can have a thickness which falls within the range of 30 nm to 60 nm.

The semiconductor layer 109 is made of an oxide semiconductor and contains, for example, InGaZnOx. A transistor which is made of an oxide semiconductor as a semiconductor layer is higher in amount of electric current (i.e., electron mobility) in an on state than a transistor which is made of a-Si. This reveals that a transistor which is made of an oxide semiconductor is approximately 20 times to 50 times higher in electron mobility in an on state than a transistor which is made of a-Si and thus is greatly superior in on characteristic. In a case where a transistor which is made of an oxide semiconductor is employed for each pixel in a MEMS display, the transistor of the each pixel is made greatly superior in on characteristic. This allows more electrons to be moved during writing of pixel data to the each pixel, allows a shorter time to be required for the writing, and consequently allows lower electric power consumption.

(Etch Stopper Film 110)

On the gate insulating film 108 and the semiconductor layer 109, an etch stopper film 110 (protective film) is provided. The etch stopper film 110 has two openings on the semiconductor layer 109, and these openings causes part of the semiconductor layer 109 to be exposed from the etch stopper film 110.

(Second Wiring Layer 111)

A second wiring layer 111A and a second wiring layer 111B are provided so as to cover respective parts of the semiconductor layer 109 which parts are exposed due to the two openings of the etch stopper film 110.

Furthermore, a second wiring layer 111C is provided on the etch stopper film 110 so as to overlap the first wiring layer 105B in plan view.

The second wiring layer 111A functions as the source electrode of the fourth transistor T4.

The second wiring layer 111B functions as the drain electrode of the fourth transistor T4.

(Passivation Film 112)

On the etch stopper film 110 and the second wiring layer 111, a passivation film 112 is provided so as to cover the etch stopper film 110 and the second wiring layer 111.

The passivation film 112 can have a thickness which falls within the range of 100 nm to 500 nm. The passivation film 112 can be, for example, an $SiO_2$ film.

(Organic Insulating Film 113)

On the passivation film 112, an organic insulating film 113 is provided so that a difference in level in the passivation film 112 disappears. The organic insulating film 113 can have a thickness which falls within the range of 0.5 µm to 3 µm.

(Third Inorganic Insulating Film 114)

On a surface of the organic insulating film 113, a third inorganic insulating film 114 is provided so that the organic insulating film 113 and a film which is provided in a layer higher than the organic insulating film 113 more securely adhere to each other. The third inorganic insulating film 114 can have a thickness which falls within the range of 50 nm to 200 nm, and the third inorganic insulating film 114 can be made of a material such as an $SiO_2$ film. Note that the third inorganic insulating film 114 can be omitted in a case where the surface of the organic insulating film 113 is plasma-treated so that the organic insulating film 113 and the film which is provided in a layer higher than the organic insulating film 113 more securely adhere to each other.

(Third Wiring Layer 115)

Above the etch stopper film 110, an ITO film 118 and a third wiring layer 115A are stacked in this order so as to overlap the second wiring layer 111B in plan view. Meanwhile, above the etch stopper film 110, a third wiring layer 115B is provided so as to overlap the second wiring layer 111C in plan view.

Furthermore, on the second wiring layer 111B, the passivation film 112, the organic insulating film 113, and the third inorganic insulating film 114 are provided with a contact hole 116. The contact hole 116 is filled with the ITO film 118. This allows the second wiring layer 111B, the ITO film 118, and the third wiring layer 115A to be electrically connected to one another via the contact hole 116.

The third wiring layer 115B functions as, for example, the shutter line S of the various wires W.

Note that the ITO film 118 does not necessarily need to be provided, but can be omitted. In a case where no ITO film 118 is provided, the second wiring layer 111B and the third wiring layer 115A can be electrically connected to each other by filling the contact hole 116 with the third wiring layer 115A.

(Fourth Inorganic Insulating Film 117)

On the third inorganic insulating film 114 and the third wiring layer 115, a fourth inorganic insulating film 117 is provided so as to cover the third inorganic insulating film 114 and the third wiring layer 115.

The fourth inorganic insulating film 117 can have a thickness which falls within the range of 50 nm to 500 nm. The fourth inorganic insulating film 117 can be, for example, an SiNx film or an $SiO_2$ film.

(Driving Beam Anchor 60)

On the third wiring layer 115A, the fourth inorganic insulating film 117 is provided with an opening. This causes part of a surface of the third wiring layer 115A to be exposed.

On an exposed part of the third wiring layer 115A, the driving beam anchor 60 of the master electrode Em is provided. The driving beam anchor 60 is electrically connected via the third wiring layer 115A to the second wiring layer 111B serving as the drain electrode of the fourth transistor T4.

(Others)

The above description discusses a cross-sectional view of the fourth transistor T4 and the shutter mechanism 20 with reference to FIG. 6. Note, however, that each of the other transistors of the MEMS display panel 10 can be similarly configured such that the light-transmitting film 106 is provided over the first wiring layer 105 serving as the gate electrode. This makes it possible to greatly reduce a wiring resistance without making the first wiring layer 105 wider.

<Process for Manufacturing MEMS Display Panel>

The following description discusses a process for manufacturing the MEMS display panel 10.

Figure 7:
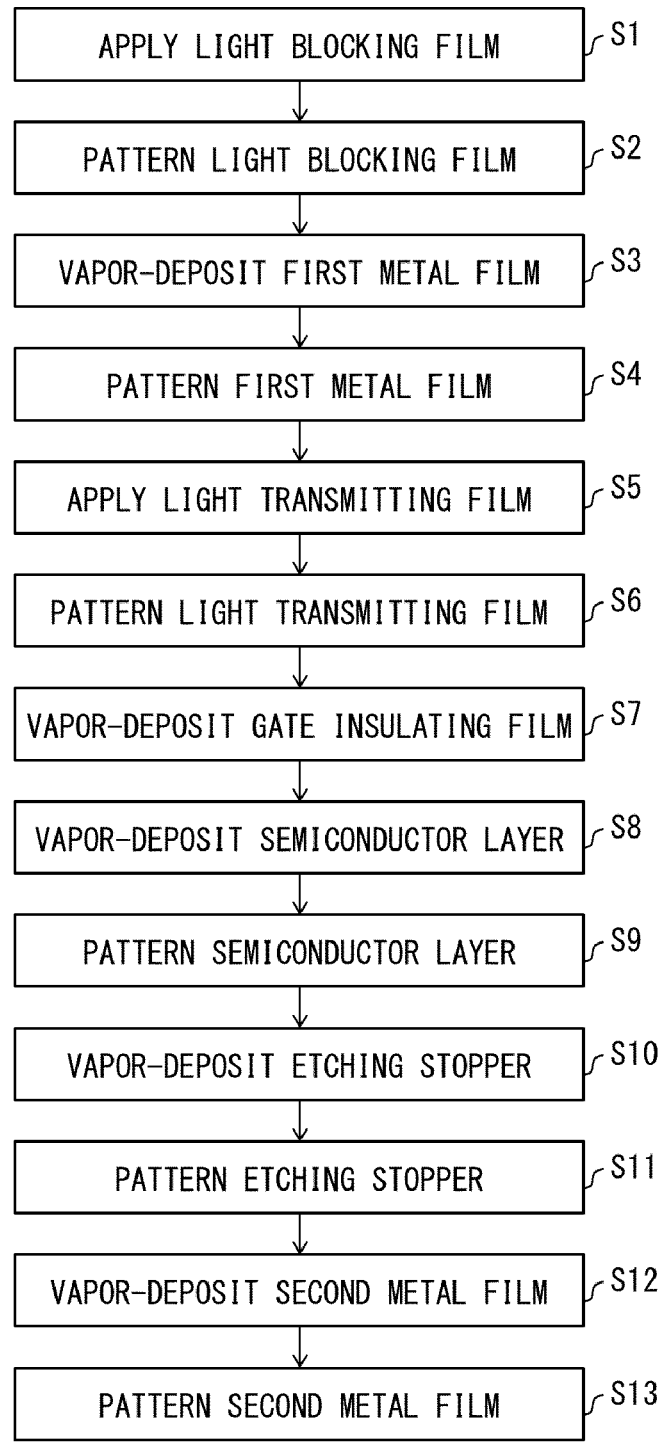
FIG. 7 is a flowchart showing part of a process for manufacturing a MEMS display panel.

FIG. 7 is a flowchart showing part of a process for manufacturing a MEMS display panel.

Figure 8:
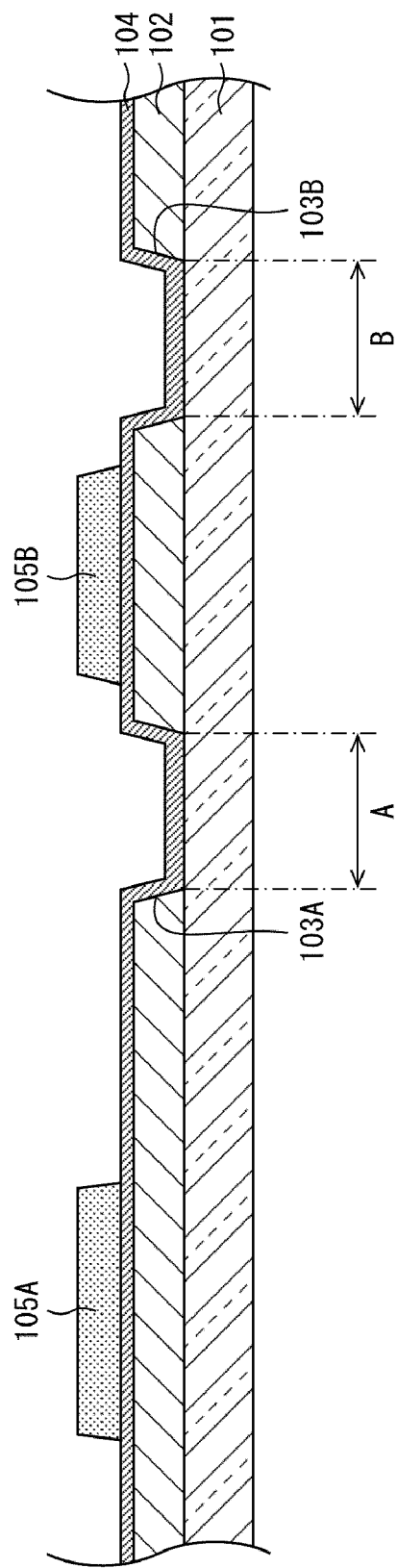
FIG. 8 is a cross-sectional view for describing a process for manufacturing a MEMS display panel.
Figure 9:
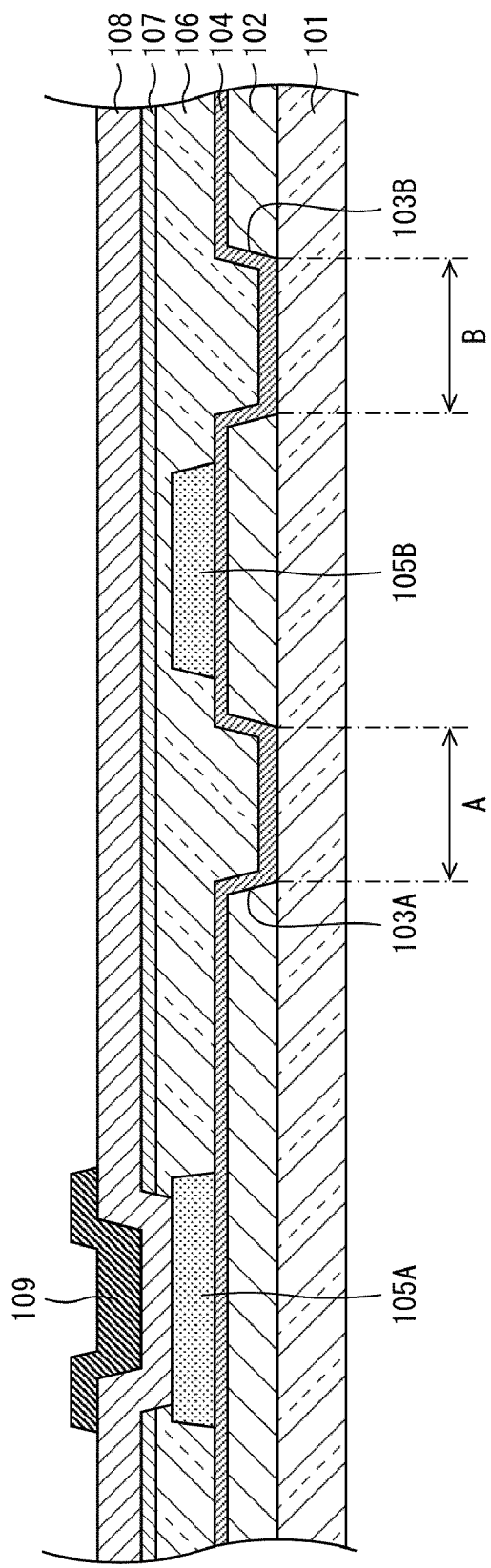
FIG. 9 is a cross-sectional view for describing a process for manufacturing a MEMS display panel.
Figure 10:
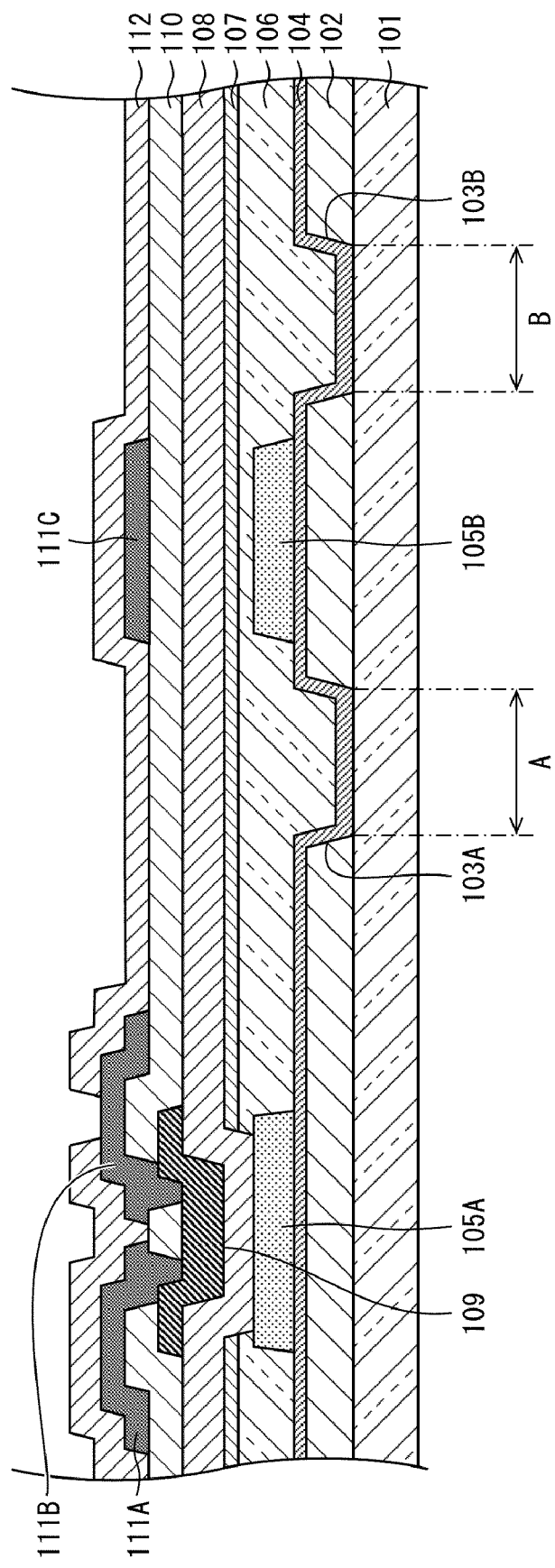
FIG. 10 is a cross-sectional view for describing a process for manufacturing a MEMS display panel.

FIGS. 8 through 10 are each a cross-sectional view for describing a process for manufacturing a MEMS display panel.

According to the process for manufacturing the MEMS display panel 10 of Embodiment 1, first, the light blocking film 102 is applied to the glass substrate 101 (S1). The light blocking film 102 can be made of a high-melting point resin (e.g., polyimide) which is colored in a dark color by containing carbon black, or a spin-on-glass (SOG) film which is colored in a dark color by containing carbon black. Furthermore, since an electrically conductive film constituting a TFT is formed in a process subsequent to the process for manufacturing the MEMS display panel 10, it is preferable to select, as a material of which the light blocking film 102 is made, a material which does not affect a TFT characteristic while an operation is carried out during the process for forming the electrically conductive film constituting the TFT and which can withstand the operation.

Next, the light blocking film 102 is patterned so that the openings 103A and 103B are formed (S2). Note that the light blocking film 102 can be patterned by dry etching. Note also that the light blocking film 102 which is made of a photosensitive material can be patterned by photolithography.

Subsequently, on the light blocking film 102, a first metal vapor-deposited film is vapor-deposited (S3). As the first metal vapor-deposited film, a single layer film which includes any one of (i) films made of metals such as aluminum (Al), tungsten (W), molybdenum (Mo), tantalum (Ta), chrome (Cr), titanium (Ti), and copper (Cu), and (ii) a film containing an alloy of such metals, or a stacked film including any two or more of the above films (i) and (ii) can be vapor-deposited.

Then, the first metal vapor-deposited film is patterned so that the first wiring layers 105A and 105B are formed as illustrated in FIG. 8 (S4). The first metal vapor-deposited film can be patterned by dry etching carried out by use of $CF_4$ gas and $O_2$ gas. The first wiring layers 105A and 105B can have a thickness which falls within the range of 50 nm to 3 μm. The first wiring layers 105A and 105B which are made thicker can have a lower wiring resistance.

Next, the light-transmitting film 106 is applied so as to cover the first wiring layers 105A and 105B (S5). The light-transmitting film 106 is made of a material which transmits light. For example, the light-transmitting film 106 can be made of a transparent high-melting point resin material such as polyimide, or an SOG film. The SOG film can be, for example, a film which contains, as a main component, silicon dioxide which is made from a solution obtained by dissolving a silicon compound in an organic solvent. Furthermore, the SOG film can be made of an inorganic SOG which contains silanol $Si(OH)_4$, an organic SOG which contains alkyl group-containing silanol $(RxSi(OH)_{4-x}$ (R is an alkyl group) as a main component, or a sol-gel material which contains a silicone or metal alkoxide. Specific examples of the inorganic SOG include a Hydrogen-silsesquioxane (HSQ)-based material. Specific examples of the organic SOG include a Methyl-silsesquioxane (MSQ)-based material. Examples of the sol-gel material include a tetraethoxysilane (TEOS)-containing material. The light-transmitting film 106 can be formed by applying and baking such a material. By forming the light-transmitting film 106 by use of an application material, it is possible to cover side surfaces (tapered surfaces) of the first wiring layers 105A and 105B without fail also in a case where the first wiring layers 105A and 105B are made thick. This makes it possible to prevent oxidation of the first wiring layers 105A and 105B which oxidation is caused by exposure of the side surfaces of the first wiring layers 105A and 105B.

Subsequently, the light-transmitting film 106 is patterned so that the first wiring layer 105A is exposed (S6). The light-transmitting film 106 can be patterned by dry etching. The light-transmitting film 106 which is made of a photosensitive material can be patterned by photolithography. This makes it possible to pattern the light-transmitting film 106 without damaging the first wiring layer 105A which has already been formed.

Then, the gate insulating film 108 is vapor-deposited (S7). Examples of the gate insulating film 108 include an SiNx film, an oxygen-containing silicon-based inorganic film (e.g., an $SiO_2$ film), and a stacked film of an $SiO_2$ film and a SiNx film.

Next, the semiconductor layer 109 is vapor-deposited and then subjected to a high-temperature annealing treatment (S8). High-temperature annealing can be carried out under a nitrogen temperature at 400° C. to 500° C. for 1 hour to 2 hours.

Subsequently, the semiconductor layer 109 is patterned as illustrated in FIG. 9 (S9).

Then, the etch stopper film 110 is vapor-deposited (S10) and then subjected to a low-temperature annealing treatment. The etch stopper film 110 can have a thickness which falls within the range of 100 nm to 500 nm. The etch stopper film 110 can be, for example, an $SiO_2$ film. Low-temperature annealing can be carried out at 200° C. to 300° C. for 1 hour. In a case where the etch stopper film 110 is vapor-deposited and then subjected to the low-temperature annealing treatment, a TFT characteristic of the semiconductor layer 109 can be stabilized.

Next, the etch stopper film 110 is patterned (S11).

Subsequently, a second metal vapor-deposited film is vapor-deposited (S12). As the second metal vapor-deposited film, a single layer film which includes any of (i) films made of metals such as aluminum (Al), tungsten (W), molybdenum (Mo), tantalum (Ta), chrome (Cr), titanium (Ti), and copper (Cu), and (ii) a film containing an alloy of such metals, or a stacked film including any two or more of the above films (i) and (ii) can be vapor-deposited.

Then, the second metal vapor-deposited film is patterned so that the second wiring layers 111A through 111C are formed as illustrated in FIG. 10 (S13). The second metal vapor-deposited film can be patterned by dry etching carried out by use of $CF_4$ gas and $O_2$ gas. The second wiring layers 111A through 111C can have a thickness which falls within the range of 50 nm to 500 nm.

Thereafter, as illustrated in FIG. 10, the passivation film 112 is formed, and the organic insulating film 113 and the third wiring layer 115 are further formed by a conventionally publicly known method, so that the MEMS display panel 10 illustrated in FIG. 6 can be obtained.

As described earlier, according to a method for manufacturing the MEMS display panel 10 of Embodiment 1, the light-transmitting film 106 is formed after the first wiring layers 105A and 105B are formed.

Thus, even in a case where the first wiring layer 105 is formed so as to be thick, a tapered part (side surface part) of the first wiring layer 105 can be protected by the light-transmitting film 106. With the configuration, as compared with a conventional MEMS display panel 10, the MEMS display panel 10 of Embodiment 1 further (i) allows the first wiring layer 105 to be designed so as to be thick and (ii) allows prevention of a signal delay which occurs in a case where a panel is made larger.

Further, as compared with a conventional MEMS display which is configured such that a first wiring layer is provided over a light-transmitting film, the MEMS display 1 of Embodiment 1 further allows a space between the first wiring layer 105 and the second wiring layer 111 to be sufficiently left. This makes it possible to restrain a parasitic capacitance from being defined by the first wiring layer 105 and the second wiring layer 111.

<Example of Structure of Transistor>

The following description discusses a structure of a transistor of the MEMS display panel of Embodiment 1.

(Etch Stopper Type)

Figure 11:
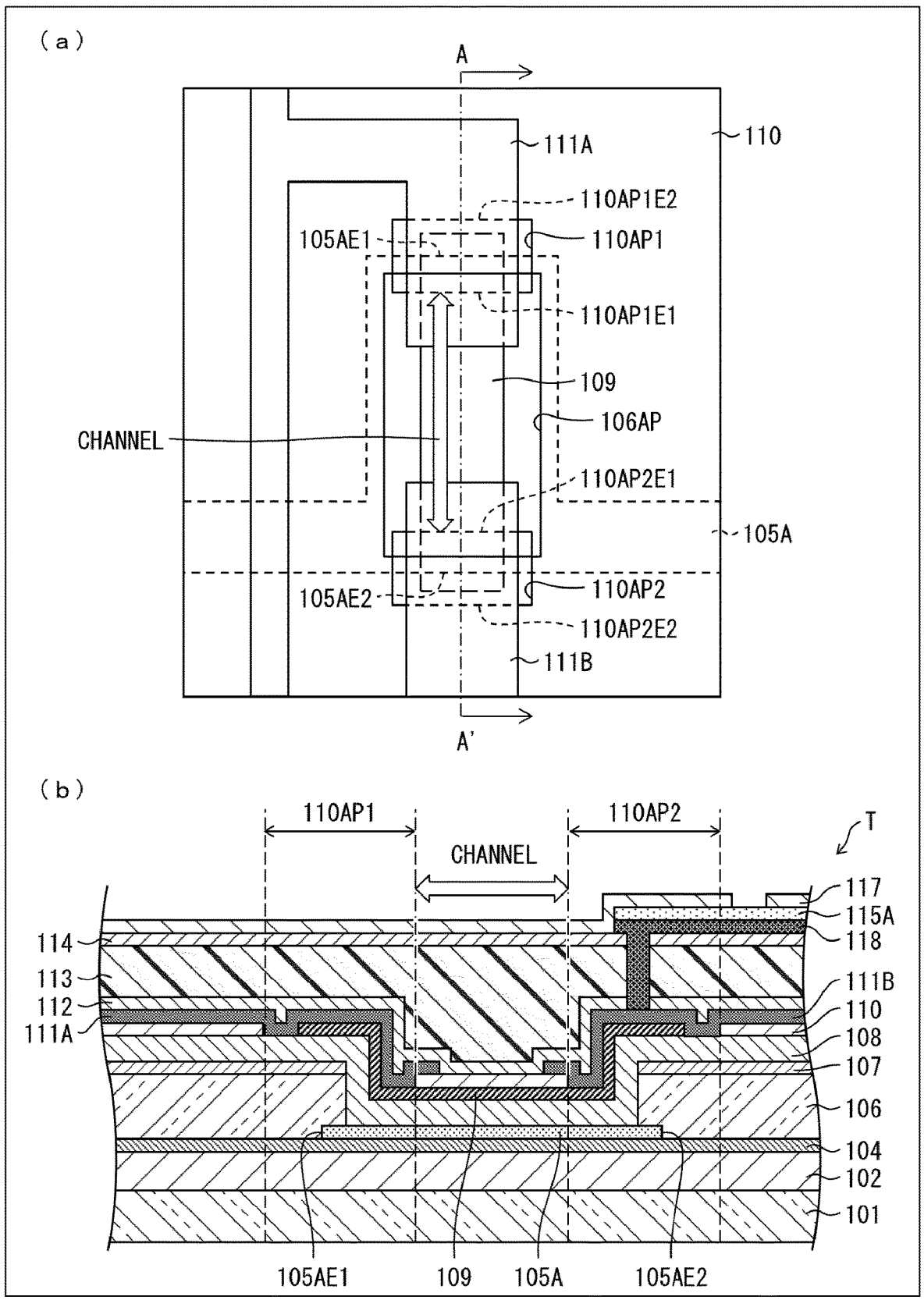
FIG. 11 is a view schematically illustrating a structure of an etch stopper type transistor as an example of a transistor of a MEMS display panel. (a) of FIG. 11 is a plan view. (b) of FIG. 11 is a cross-sectional view taken along the line A-A' of (a) of FIG. 11.

FIG. 11 is a view schematically illustrating a structure of an etch stopper type transistor as an example of the transistor of the MEMS display panel of Embodiment 1. (a) of FIG. 11 is a plan view. (b) of FIG. 11 is a cross-sectional view taken along the line A-A' of (a) of FIG. 11.

As in (b) of FIG. 11, the gate insulating film 108 and the semiconductor layer 109 are provided in an opening 106AP of the light-transmitting film 106 so as to cover the first wiring layer 105A.

As illustrated in (a) of FIG. 11, the etch stopper film 110 has two openings with respect to a single channel. Each of these openings, which are an opening 110AP1 (first opening) and an opening 110AP2 (second opening), causes part of the semiconductor layer 109 to be exposed from the etch stopper film 110.

As in (b) of FIG. 11, the opening 110AP1, which is one of the openings of the etch stopper film 10, is covered with the second wiring layer 111A, and the second wiring layer 111A and the semiconductor layer 109 are in contact with each other inside the opening 110AP1. Meanwhile, the opening 110AP2, which is the other of the openings of the etch stopper film 10, is covered with the second wiring layer 111B, and the second wiring layer 111B and the semiconductor layer 109 are in contact with each other inside the opening 110AP2.

An end of the opening 110AP1 and an end of the opening 110AP2 which end faces the end of the opening 110AP1 are provided inside the opening 106AP of the light-transmitting film 106 and on the semiconductor layer 109. That is, the openings 110AP1 and 110AP2 are, for example, quadrangular in plan view (see (a) of FIG. 11). Opening ends which define the opening 110AP1 include an opening end 110AP1E1 (first opening end) closer to the opening 110AP2, and opening ends which define the opening 110AP2 include an opening end 110AP2E1 (second opening end) closer to the opening 110AP1. The opening end 110AP1E1 and the opening end 110AP2E1 are provided inside the opening 106AP and on the semiconductor layer 109.

In view of the above, according to the MEMS display panel 10, a channel of a transistor T is provided inside the opening 106AP (transmitting film opening) of the light-transmitting film 106. In a case where the opening end 110AP1E1 of the opening 110AP1 of the etch stopper film 110 on the semiconductor layer 109 and the opening end 110AP2E1 of the opening 110AP2 of the etch stopper film 110 on the semiconductor layer 109 are thus provided inside the opening 106AP of the light-transmitting film 106, the transistor T whose channel length is accurately defined can be provided.

Furthermore, as in (b) of FIG. 11, an opening end of the light-transmitting film 106 overlaps the first wiring layer 105A, and all the opening 106AP of the light-transmitting film 106 can overlap the first wiring layer 105A (gate electrode). The configuration makes it possible to restrain a parasitic capacitance from being defined by the second wiring layer 111A (source), the second wiring layer 111B (drain), and the first wiring layer 105A (gate).

Such an etch stopper type transistor T as illustrated in FIG. 11 makes it possible to prevent or reduce damage to the semiconductor layer 109 during the step of patterning the second wiring layer 111.

Moreover, according to the etch stopper type transistor T, edge parts of the first wiring layer 105A overlaps the openings 110AP1 and 110AP2 of the etch stopper film 110 in plan view. That is, as illustrated in FIG. 11, the first wiring layer 105A has a first edge part 105AE1 which is located between the opening end 110AP1E1 of the opening 110AP1 and an opening end 110AP1E2 (third opening end) facing the opening end 110AP1E1. Furthermore, the first wiring layer 105A has a second edge part 105AE2 which is located between the opening end 110AP2E1 of the opening 110AP2 and an opening end 110AP2E2 (fourth opening end) facing the opening end 110AP2E.

With the configuration, the first wiring layer 105A is provided so as to be wider than the channel, and it is possible to restrain a parasitic capacitance from being defined by the first wiring layer 105 and the second wiring layer 111.

(Channel Etch Type)

Figure 12:
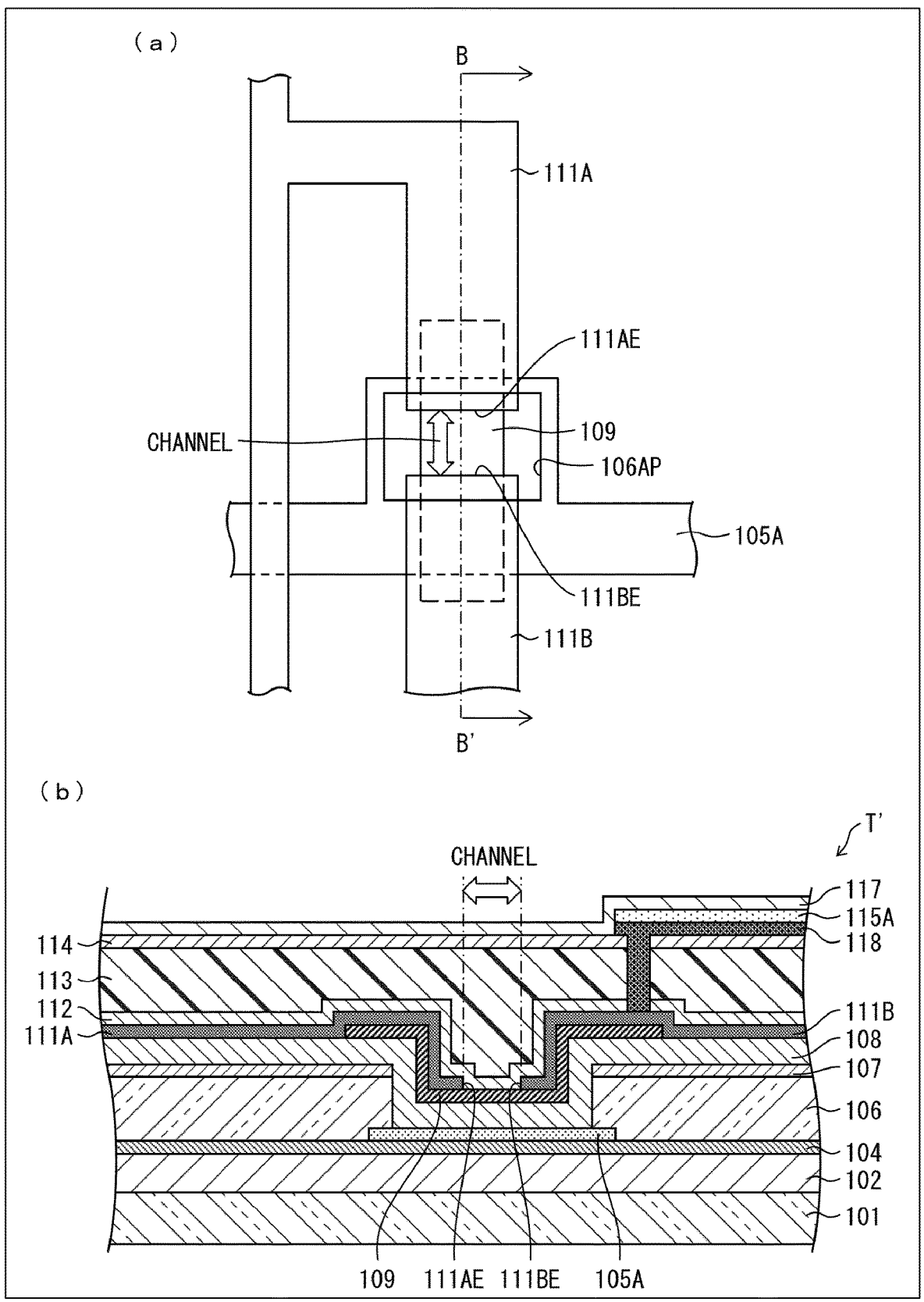
FIG. 12 is a view schematically illustrating a structure of a channel etch type transistor as an example of a transistor of a MEMS display panel. (a) of FIG. 12 is a plan view. (b) of FIG. 12 is a cross-sectional view taken along the line B-B' of (a) of FIG. 12.

FIG. 12 is a view schematically illustrating a structure of a channel etch type transistor as an example of the transistor of the MEMS display panel of Embodiment 1. (a) of FIG. 12 is a plan view. (b) of FIG. 12 is a cross-sectional view taken along the line B-B' of (a) of FIG. 12.

As illustrated in (b) of FIG. 12, the gate insulating film 108 and the semiconductor layer 109 are provided in the opening 106AP of the light-transmitting film 106 so as to cover the first wiring layer 105A, and the second wiring layer 111A and the second wiring layer 111B are provided on the semiconductor layer 109 so as to define the channel length in the opening 106AP in plan view. In other words, an end 111AE of the second wiring layer 111A and an end 111BE of the second wiring layer 111B, the end 111AE and the end 111BE facing each other, are located on the semiconductor layer 109 inside the opening 106AP.

In view of the above, according to the MEMS display panel 10, a channel of a transistor T' is provided inside the opening 106AP of the light-transmitting film 106. The transistor T whose channel length is accurately defined thus can be formed in accordance with where the end 111AE of the second wiring layer 111A and the end 111BE of the second wiring layer 111B are located.

Furthermore, as in (b) of FIG. 12, the opening end of the light-transmitting film 106 overlaps the first wiring layer 105A, and all the opening 106AP of the light-transmitting film 106 can overlap the first wiring layer 105A (gate electrode). The configuration makes it possible to restrain a parasitic capacitance from being defined by the second wiring layer 111A (source), the second wiring layer 111B (drain), and the first wiring layer 105A (gate).

Such a channel etch type transistor T' as illustrated in FIG. 12 makes it possible to reduce a parasitic capacitance which is defined by the first wiring layer 105A serving as the gate electrode, the second wiring layer 111A serving as the source electrode, and the second wiring layer 111B serving as the drain electrode.

<Variation 1>

Figure 13:
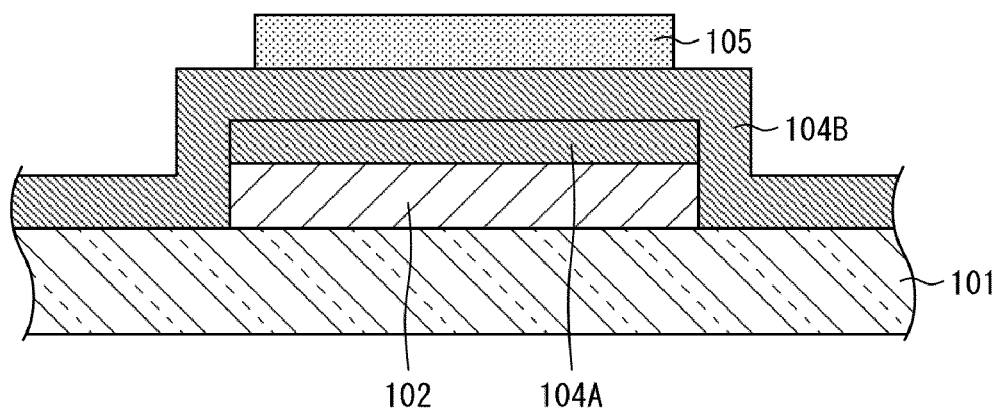
FIG. 13 is a cross-sectional view illustrating a configuration of a MEMS display panel in accordance with Variation 1.

FIG. 13 is a cross-sectional view illustrating a configuration of a MEMS display panel in accordance with Variation 1.

Note that for description, FIG. 13 illustrates an extracted part of a layer structure of the MEMS display panel.

As illustrated in FIG. 13, according to the MEMS display panel in accordance with Variation 1, a first protective film 104A and a second protective film 104B are provided between a light blocking film 102 and a first wiring layer 105. The first protective film 104A is provided on the light blocking film 102. The second protective film 104B is provided on the first protective film 104A and a glass substrate 101. Each of the first protective film 104A and the second protective film 104B can be, for example, an SiO$_2$ film or a SiNx film.

Figure 14:
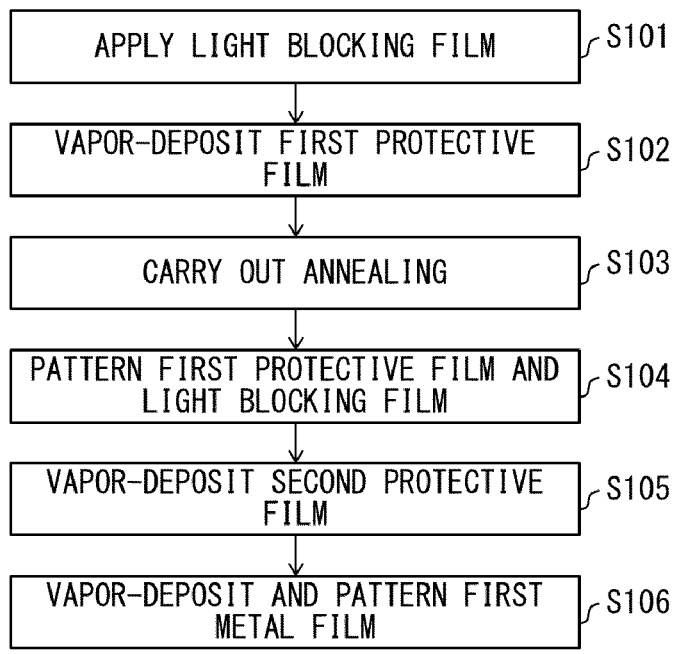
FIG. 14 is a flowchart showing part of a process for manufacturing the MEMS display panel in accordance with Variation 1.

FIG. 14 is a flowchart showing part of a process for manufacturing the MEMS display panel in accordance with Variation 1.

According to the process for manufacturing the MEMS display panel in accordance with Variation 1, first, the light blocking film 102 is applied to the glass substrate 101 (S101). Next, the first protective film 104A is formed on the light blocking film 102 (S102). Subsequently, the light blocking film 102 and the first protective film 104A are subjected to a high-temperature annealing treatment (S103). Then, the light blocking film 102 and the first protective film 104A are patterned (S104). Next, the second protective film 104B is formed on the glass substrate 101 so as to cover the first protective film 104A (S105). Subsequently, a first metal vapor-deposited film is formed on the second protective film 104B and patterned, so that the first wiring layer 105 is formed so as to overlap the light blocking film 102 (S106). Note that the step of forming the second protective film 104B can be omitted during the above manufacturing process.

According to the MEMS display panel of Embodiment 1, the first wiring layer 105 is used as a gate wire of a transistor. Thus, in order to achieve a reliable transistor, the first wiring layer 105 is required to be highly smooth.

In a case where the light blocking film 102 is made of a hybrid material of an organic material and an inorganic material, such as carbon black-containing polyimide or an SOG film, in order to restrain heat shrinkage from drastically occurring in the light blocking film 102 due to the high-temperature annealing treatment carried out in a subsequent step, it is preferable to carry out the high-temperature annealing treatment with respect to the light blocking film 102 before and after patterning the light blocking film 102. Note, however, that, assuming that the light blocking film 102 is subjected to the high-temperature annealing treatment while no film is formed on a surface thereof, the surface of the light blocking film 102 is made uneven. This causes a deterioration in surface smoothness of the first wiring layer 105 which is provided over the light blocking film 102, and consequently affects reliability of a transistor.

In order to solve this problem, as in the steps described earlier, in a case where the first protective film 104A is formed on the light blocking film 102 and then the light blocking film 102 and the first protective film 104A are subjected to the high-temperature annealing treatment, it is possible to restrain the light blocking film 102 from having an uneven surface. This makes it possible to provide the first wiring layer 105 which has high surface smoothness.

Furthermore, the first wiring layer 105 can be made of a low-resistance metal material, e.g., aluminum. Note, however, that, in a case where the first wiring layer 105 which has a thickness of approximately 1 μm is formed by use of aluminum, a so-called hillock appears due to a heat treatment carried out during the formation of the first wiring layer 105 and/or in a subsequent step. This causes the first wiring layer 105 to have an uneven surface.

In order to solve this problem, in a case where the first wiring layer 105 is made of a copper material, it is possible to provide the first wiring layer 105 which has a thickness of approximately 1 μm and has high surface smoothness.

Embodiment 2

Another embodiment of the present invention is described below with reference to FIGS. 15 through 18. Note that, for convenience, members having functions identical to those of the respective members described in Embodiment 1 are given respective identical reference signs, and a description of those members is omitted here.

Figure 15:
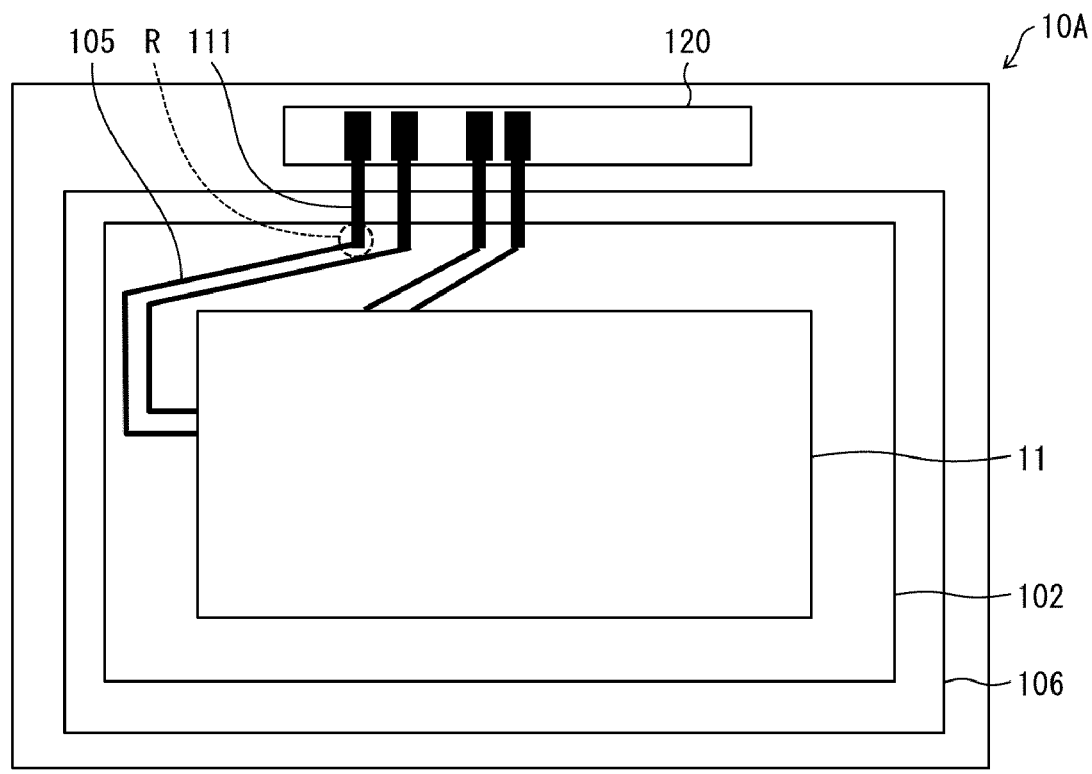
FIG. 15 is a plan view illustrating a configuration of a MEMS display panel in accordance with Embodiment 2 of the present invention.

FIG. 15 is a plan view illustrating a configuration of a MEMS display panel in accordance with Embodiment 2.

Figure 16:
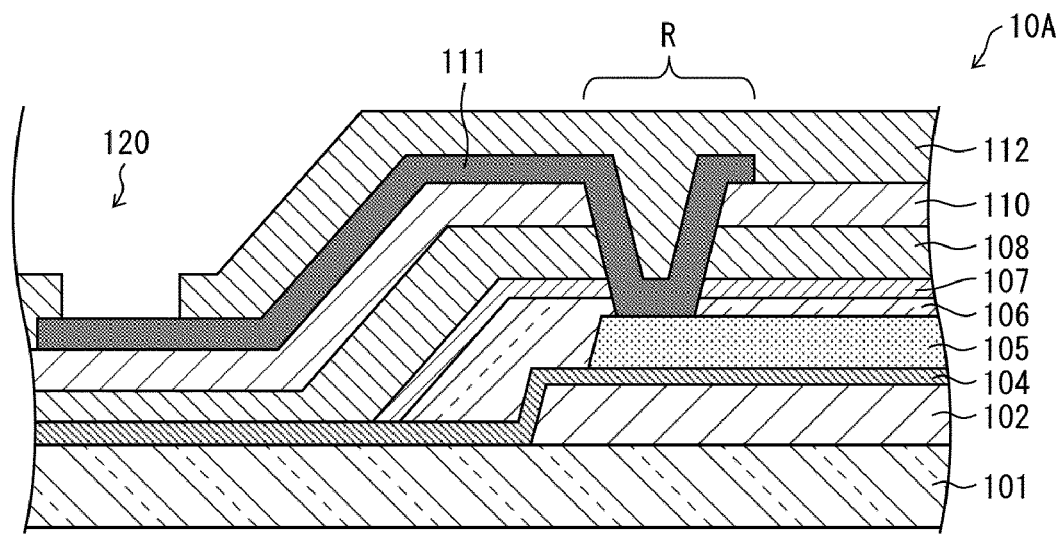
FIG. 16 is a cross-sectional view illustrating a configuration of a TFT substrate of the MEMS display panel in accordance with Embodiment 2.

FIG. 16 is a cross-sectional view illustrating a configuration of a TFT substrate of the MEMS display panel in accordance with Embodiment 2.

As illustrated in FIG. 15, according to the MEMS display panel of Embodiment 2, in plan view, a light blocking film 102 extends to an outside of a display region 11, and a light-transmitting film 106 extends to an outside of the light blocking film 102.

Furthermore, wires that are extended from the display region 11 to a pad part 120 are constituted by a first wiring layer 105 and a second wiring layer 111. Specifically, the first wiring layer 105 is extended from the display region 11 to the outside of the display region 11, the first wiring layer 105 and the second wiring layer 111 are connected to each other outside an outer edge of the display region 11 and inside an outer edge of the light blocking film 102, e.g., at a connection R of FIG. 16, and the second wiring layer 111 extends across an outer edge part of the light blocking film 102.

Moreover, the second wiring layer 111 extends so as to be outer than the light-transmitting film 106 and a sealed part, so that the second wiring layer 111 forms the pad part 120. In a case where a terminal of the pad part 120 is thus constituted by the second wiring layer 111, the light-transmitting film 106 can be removed in a part which is under a pressure during production. This raises no fear of appearance of a crack in the light-transmitting film 106.

FIG. 16 is a cross-sectional view at the connection R of FIG. 15 at which connection R the first wiring layer 105 and the second wiring layer 111 are connected to each other.

As illustrated in FIG. 16, at the connection R, the light-transmitting film 106, a second inorganic insulating film 107, a gate insulating film 108, and an etch stopper film 110 are provided with a contact hole, and the first wiring layer 105 and the second wiring layer 111 are electrically connected to each other via the contact hole.

In a case where the light blocking film 102 is made of a high-melting point resin containing, for example, carbon black, carbon particles rupture on a surface of the light blocking film 102, so that the surface is made rough. In particular, a surface of a tapered part of the light blocking film 102 is made rough.

According to a MEMS display panel 10 of Embodiment 2, the first wiring layer 105 is provided over the light blocking film 102 while no light-transmitting film 106 is provided between the light blocking film 102 and the first wiring layer 105. Thus, assuming that the first wiring layer 105 is extended across the outer edge part of the light blocking film 102 to the pad part 120, the first wiring layer 105 is provided over the tapered part of the light blocking film 102. However, since the surface of the tapered part of the light blocking film 102 is rough, the first wiring layer 105 is broken over the tapered part of the light blocking film 102, or a film residue is left due to inaccurate patterning of the first wiring layer 105.

In order to solve this problem, as illustrated in FIG. 16, without the need to provide an electrically conductive film on the tapered part of the light blocking film 102, it is possible to extend the wires to a region outside the light blocking film 102 by electrically connecting the first wiring layer 105 and the second wiring layer 111 to each other at the connection R and causing the second wiring layer 111, which is provided so as to be upper than the light-transmitting film 106, to extend across the outer edge part of the light blocking film 102, which is covered with the light-transmitting film 106.

<Example of Structure of Connection R>

The following description more specifically discusses the connection R of FIG. 16 in the cases of an etch stopper type transistor, a channel etch type transistor, and a CE.

Figure 17:
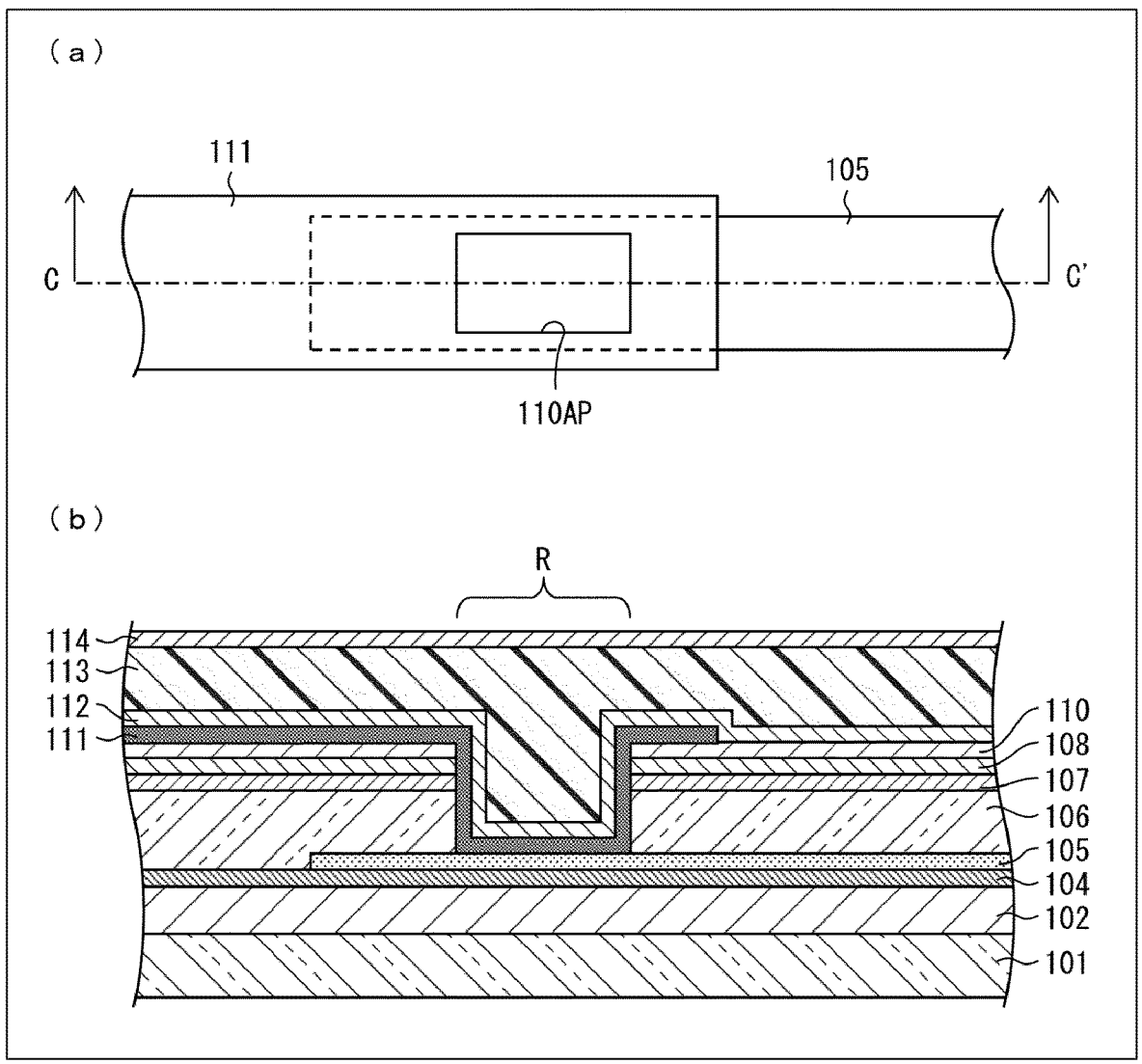
FIG. 17 is a view schematically illustrating a structure of a connection between a first wiring layer and a second wiring layer in a case where a transistor is of an etch stopper type. (a) of FIG. 17 is a plan view. (b) of FIG. 17 is a cross-sectional view taken along the line C-C' of (a) of FIG. 17.

FIG. 17 is a view schematically illustrating a structure of a connection between a first wiring layer and a second wiring layer in a case where a transistor of the MEMS display panel of Embodiment 2 is of an etch stopper type. (a) of FIG. 17 is a plan view. (b) of FIG. 17 is a cross-sectional view taken along the line C-C' of (a) of FIG. 17.

As illustrated in (b) of FIG. 17, in a case where the transistor of the MEMS display panel is of the etch stopper type, a glass substrate 101, the light blocking film 102, a first inorganic insulating film 104, the first wiring layer 105, the light-transmitting film 106, the second inorganic insulating film 107, the gate insulating film 108, the etch stopper film 110, and the second wiring layer 111 are stacked in this order around the connection R between the first wiring layer 105 and the second wiring layer 111 in a region between the outer edge of the display region 11 and the outer edge of the light blocking film 102.

At the connection R, the light-transmitting film 106, the second inorganic insulating film 107, the gate insulating film 108, and the etch stopper film 110 are provided with a contact hole, and the first wiring layer 105 and the second wiring layer 111 are electrically connected to each other via the contact hole.

Figure 18:
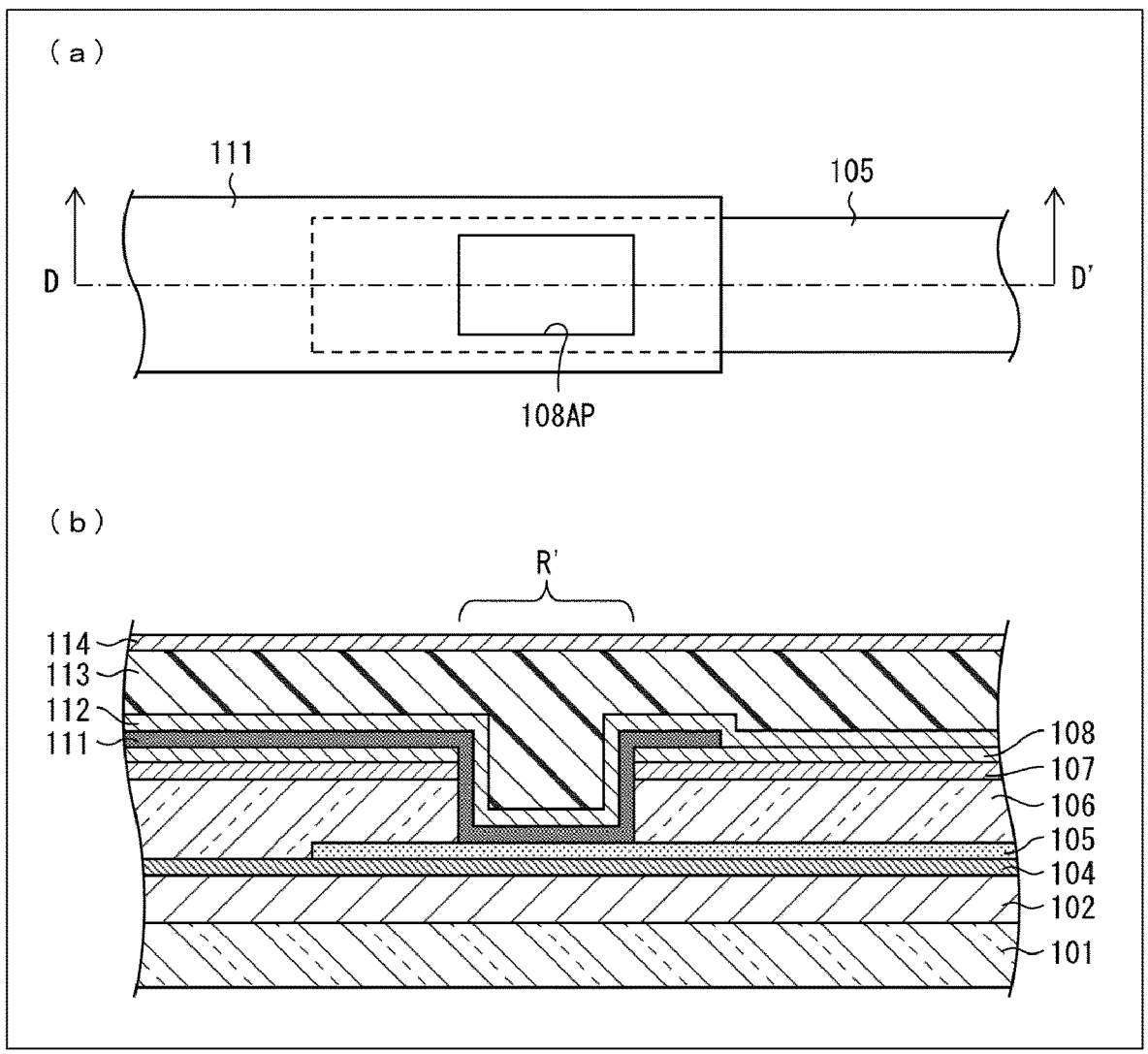
FIG. 18 is a view schematically illustrating a structure of a connection between a first wiring layer and a second wiring layer in a case where a transistor is of a channel etch type. (a) of FIG. 18 is a plan view. (b) of FIG. 18 is a cross-sectional view taken along the line D-D' of (a) of FIG. 18.

FIG. 18 is a view schematically illustrating a structure of a connection between a first wiring layer and a second wiring layer in a case where a transistor of the MEMS display panel of Embodiment 2 is of a channel etch type. (a) of FIG. 18 is a plan view. (b) of FIG. 18 is a cross-sectional view taken along the line D-D' of (a) of FIG. 18.

As illustrated in (b) of FIG. 18, in a case where the transistor of the MEMS display panel is of the channel etch type, the glass substrate 101, the light blocking film 102, the first inorganic insulating film 104, the first wiring layer 105, the light-transmitting film 106, the second inorganic insulating film 107, the gate insulating film 108, the, and the second wiring layer 111 are stacked in this order around a connection R' between the first wiring layer 105 and the second wiring layer 111 in the region between the outer edge of the display region 11 and the outer edge of the light blocking film 102.

At the connection R', the light-transmitting film 106, the second inorganic insulating film 107, and the gate insulating film 108 are provided with a contact hole, and the first wiring layer 105 and the second wiring layer 111 are electrically connected to each other via the contact hole.

[Recap]

A display panel (MEMS display panel 10) of a first aspect which display panel allows an amount of transmitted light to be controlled for each pixel (P), the display panel includes: a substrate (glass substrate 101); a light blocking film (102) which is provided over the substrate so as to have an opening (103A and 103B) corresponding to the each pixel; a light-transmitting film (106) by which the opening is filled and flattened; and a first wiring layer (105A) which serves as part of a wire configured to electrically control the amount of transmitted light for the each pixel, the first wiring layer being provided over the light blocking film, and the light-transmitting film being provided in a layer higher than the first wiring layer so as to cover a side surface of the first wiring layer. With the configuration, also in a case where the first wiring layer is made greater in thickness and made greater in taper angle, a side surface of the first wiring layer is less likely to be exposed. This allows the first wiring layer to be thicker without making the first wiring layer wider. Thus, it is possible to greatly reduce a wiring resistance. As a result, a wiring delay can be prevented also in a case where the display panel is made larger.

A display panel of a second aspect can be configured such that: in the first aspect, the first wiring layer serves as a gate electrode of a transistor (T1 through T5) configured to electrically control the amount of transmitted light for the each pixel; the light-transmitting film has a transmitting film opening (opening 106AP) which causes an upper surface of the first wiring layer to be exposed; and inside the transmitting film opening, a gate insulating film and a semiconductor layer are provided over the first wiring layer. The configuration allows a space between the first wiring layer serving as the gate electrode and a source electrode to be sufficiently left. This makes it possible to restrain a parasitic capacitance from being defined by the gate electrode and the source electrode.

A display panel of a third aspect can be configured such that, in the second aspect, the semiconductor layer (109) of the transistor is made of an oxide semiconductor.

A display panel of a fourth aspect can be configured such that, in the second or third aspect, the transmitting film opening has an opening end which overlaps the first wiring layer in plan view.

A display panel of a fifth aspect can be configured such that, in any one the second through third aspects, the transistor has a channel which is provided inside the transmitting film opening.

A display panel of a sixth aspect can be configured such that: in the fifth aspect, a protective film (etch stopper film 110) is provided over the semiconductor layer; the protective film has a first opening (opening 110AP1) and a second opening (opening 110AP2), the first opening causing a first part of the semiconductor layer to be exposed and being covered with a source electrode, the second opening causing a second part of the semiconductor layer to be exposed and being covered with a drain electrode; opening ends which define the first opening include a first opening end (opening end 110AP1E1) closer to the second opening; opening ends which define the second opening include a second opening end (opening end 110AP2E1) closer to the first opening; and the first opening end and the second opening face each other and are provided inside the transmitting film opening.

A display panel of a seventh aspect can be configured such that: in the sixth aspect, the first wiring layer has a first edge part (105AE1) which is located between the first opening end of the first opening and a third opening end (opening end 110AP1E2) facing the first opening end; and the first wiring layer has a second edge part (105AE2) which is located between the second opening end of the second opening and a fourth opening end (opening end 110AP2E2) facing the second opening end.

A display panel of an eighth aspect can be configured such that: in the fifth aspect, a source electrode and a drain electrode of the transistor are provided on the semiconductor layer; and an end of the source electrode and an end of the drain electrode which face each other are provided inside the transmitting film opening.

A display panel of a ninth aspect can be configured such that: in any one of the first through eighth aspects, the light blocking film is provided so as to extend, in plan view, to an outside of a display region (11) in which the each pixel is provided; the light-transmitting film has, outside the display region, a contact hole which overlaps the light blocking film; and the first wiring layer and a second wiring layer (111) which is a wire extending from the light blocking film to an end of the substrate are electrically connected to each other via the contact hole. By connecting the second wiring layer and the first wiring layer to each other via the contact hole and extending the second wiring layer to a region outer than an outer edge of the light blocking film, it is possible to extend the wire to an outside of the light blocking film without the need to provide an electrically conductive film on a tapered part of the light blocking film.

A display device (MEMS display 1) of a tenth aspect includes: the display panel recited in any one of the first through ninth aspects; and a light source (backlight 80) configured to emit light to the display panel.

A method of an eleventh aspect for manufacturing a display panel which allows an amount of transmitted light to be controlled for each pixel, the display panel including: a substrate; a light blocking film which is provided over the substrate so as to have an opening corresponding to the each pixel; a light-transmitting film by which the opening is filled and flattened; and a first wiring layer which serves as part of a wire configured to electrically control the amount of transmitted light for the each pixel, the method includes the steps of: forming the light blocking film over the substrate; forming the first wiring layer over the light blocking film; and forming the light-transmitting film in a layer higher than the first wiring layer so as to cover a side surface of the first wiring layer.

The present invention is not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

REFERENCE SIGNS LIST

1 MEMS display (display device)
10 MEMS display panel (display panel)
20 Shutter mechanism
80 Backlight (light source)
101 Glass substrate (substrate)
102 Light blocking film
103A, 103B Opening
105, 105A, 105B First wiring layer
105AE1, 105AE2 Edge part
106 Light-transmitting film
108 Gate insulating film
109 Semiconductor layer
110 Etch stopper film (protective film)
110AP1E1 Opening end (first opening end)
110AP2E1 Opening end (second opening end)
110AP1E2 Opening end (third opening end)
110AP2E2 Opening end (fourth opening end)
111 Second wiring layer
P Pixel
T1 First transistor (transistor)
T2 Second transistor (transistor)
T3 Third transistor (transistor)
T4 Fourth transistor (transistor)
T5 Fifth transistor (transistor)

The invention claimed is:

1. A display panel that allows an amount of transmitted light to be controlled for each pixel, the display panel comprising:
a substrate;
a light blocking film that is provided over the substrate and includes an opening corresponding to the each pixel;
a light-transmitting film by which the opening is filled and flattened; and
a first wiring layer that is a portion of a wire that electrically controls the amount of transmitted light for the each pixel,
the first wiring layer is provided over the light blocking film,
the light-transmitting film is provided in a layer higher than the first wiring layer to cover a side surface of the first wiring layer, wherein
the first wiring layer serves as a gate electrode of a transistor that electrically controls the amount of transmitted light for the each pixel,
the light-transmitting film includes a transmitting film opening that causes an upper surface of the first wiring layer to be exposed,
a gate insulating film and a semiconductor layer are provided over the first wiring layer inside the transmitting film opening,
the transistor includes a channel that is provided inside the transmitting film opening,
a protective film is provided over the semiconductor layer,
the protective film includes a first opening and a second opening,
the first opening causing a first portion of the semiconductor layer to be exposed and being covered with a source electrode, the second opening causing a second portion of the semiconductor layer to be exposed and being covered with a drain electrode, opening ends that define the first opening include a first opening end closer to the second opening, opening ends that define the second opening include a second opening end closer to the first opening, and the first opening end and the second opening end oppose each other and are provided inside the transmitting film opening.

2. The display panel as set forth in claim 1, wherein the semiconductor layer is made of an oxide semiconductor.

3. The display panel as set forth in claim 1, wherein the transmitting film opening includes an opening end that overlaps the first wiring layer in a plan view.

4. The display panel as set forth in claim 1, wherein:
a source electrode and a drain electrode of the transistor are provided on the semiconductor layer; and
an end of the source electrode and an end of the drain electrode that oppose each other are provided inside the transmitting film opening.

5. The display panel as set forth in claim 1, wherein:
the light blocking film is provided to extend, in a plan view, to an outside of a display region in which the each pixel is provided;
the light-transmitting film includes, outside the display region, a contact hole that overlaps the light blocking film; and
the first wiring layer and a second wiring layer, which is a wire extending from an area over the light blocking film to an end of the substrate, are electrically connected to each other via the contact hole.

6. A display device comprising:
the display panel recited in claim 1; and
a light source that emits light to the display panel.

7. A display panel that allows an amount of transmitted light to be controlled for each pixel, the display panel comprising:
a substrate;
a light blocking film that is provided over the substrate and includes an opening corresponding to the each pixel;
a light-transmitting film by which the opening is filled and flattened; and
a first wiring layer that is a portion of a wire that electrically controls the amount of transmitted light for the each pixel, wherein
the first wiring layer is provided over the light blocking film,
the light-transmitting film is provided in a layer higher than the first wiring layer to cover a side surface of the first wiring layer,
the first wiring layer serves as a gate electrode of a transistor configured to electrically control the amount of transmitted light for the each pixel,
the light-transmitting film has a transmitting film opening which causes an upper surface of the first wiring layer to be exposed,
a gate insulating film and a semiconductor layer are provided over the first wiring layer inside the transmitting film opening,
the transistor includes a channel that is provided inside the transmitting film opening,
a protective film is provided over the semiconductor layer,
the protective film includes a first opening and a second opening, the first opening causing a first portion of the semiconductor layer to be exposed and being covered with a source electrode, the second opening causing a second portion of the semiconductor layer to be exposed and being covered with a drain electrode, opening ends that define the first opening include a first opening end closer to the second opening, opening ends that define the second opening include a second opening end closer to the first opening, the first opening end and the second opening end oppose each other and are provided inside the transmitting film opening, the first wiring layer includes a first edge portion that is located between the first opening end of the first opening and a third opening end opposing the first opening end, and the first wiring layer includes a second edge portion that is located between the second opening end of the second opening and a fourth opening end opposing the second opening end.

8. The display panel as set forth in claim 7, wherein the semiconductor layer is made of an oxide semiconductor.

9. The display panel as set forth in claim 7, wherein the transmitting film opening includes an opening end that overlaps the first wiring layer in a plan view.

10. The display panel as set forth in claim 7, wherein:
a source electrode and a drain electrode of the transistor are provided on the semiconductor layer; and
an end of the source electrode and an end of the drain electrode that oppose each other are provided inside the transmitting film opening.

11. The display panel as set forth in claim 7, wherein:
the light blocking film is provided to extend, in a plan view, to an outside of a display region in which the each pixel is provided;
the light-transmitting film includes, outside the display region, a contact hole that overlaps the light blocking film; and
the first wiring layer and a second wiring layer, which is a wire extending from an area over the light blocking film to an end of the substrate, are electrically connected to each other via the contact hole.

12. A display device comprising:
the display panel recited in claim 7; and
a light source that emits light to the display panel.

13. A method for manufacturing a display panel that allows an amount of transmitted light to be controlled for each pixel, the display panel including:
a substrate;
a light blocking film that is provided over the substrate and includes an opening corresponding to the each pixel;
a light-transmitting film by which the opening is filled and flattened; and
a first wiring layer that is a portion of a wire that electrically controls the amount of transmitted light for the each pixel, the method comprising the steps of:
forming the light blocking film over the substrate;
forming the first wiring layer over the light blocking film; and
forming the light-transmitting film in a layer higher than the first wiring layer to cover a side surface of the first wiring layer, wherein
the first wiring layer serves as a gate electrode of a transistor that electrically controls the amount of transmitted light for the each pixel, the light-transmitting film includes a transmitting film opening that causes an upper surface of the first wiring layer to be exposed, a gate insulating film and a semiconductor layer are provided over the first wiring layer inside the transmitting film opening, the transistor includes a channel that is provided inside the transmitting film opening, a protective film is provided over the semiconductor layer, the protective film includes a first opening and a second opening, the first opening causing a first portion of the semiconductor layer to be exposed and being covered with a source electrode, the second opening causing a second portion of the semiconductor layer to be exposed and being covered with a drain electrode, opening ends that define the first opening include a first opening end closer to the second opening, opening ends that define the second opening include a second opening end closer to the first opening, and the first opening end and the second opening end oppose each other and are provided inside the transmitting film opening.

14. A method for manufacturing a display panel that allows an amount of transmitted light to be controlled for each pixel, the display panel including:

a substrate;

a light blocking film that is provided over the substrate and includes an opening corresponding to the each pixel;

a light-transmitting film by which the opening is filled and flattened; and a first wiring layer that is a portion of a wire that electrically controls the amount of transmitted light for the each pixel, the method comprising the steps of:

forming the light blocking film over the substrate;

forming the first wiring layer over the light blocking film; and forming the light-transmitting film in a layer higher than the first wiring layer to cover a side surface of the first wiring layer, wherein the first wiring layer is provided over the light blocking film, the light-transmitting film is provided in a layer higher than the first wiring layer to cover a side surface of the first wiring layer, the first wiring layer serves as a gate electrode of a transistor configured to electrically control the amount of transmitted light for the each pixel, the light-transmitting film has a transmitting film opening which causes an upper surface of the first wiring layer to be exposed, a gate insulating film and a semiconductor layer are provided over the first wiring layer inside the transmitting film opening, the transistor includes a channel that is provided inside the transmitting film opening, a protective film is provided over the semiconductor layer, the protective film includes a first opening and a second opening, the first opening causing a first portion of the semiconductor layer to be exposed and being covered with a source electrode, the second opening causing a second portion of the semiconductor layer to be exposed and being covered with a drain electrode, opening ends that define the first opening include a first opening end closer to the second opening, opening ends that define the second opening include a second opening end closer to the first opening, the first opening end and the second opening end oppose each other and are provided inside the transmitting film opening, the first wiring layer includes a first edge portion that is located between the first opening end of the first opening and a third opening end opposing the first opening end, and the first wiring layer includes a second edge portion that is located between the second opening end of the second opening and a fourth opening end opposing the second opening end.

* * * * *